United States Patent
Kim et al.

(10) Patent No.: US 8,811,080 B2
(45) Date of Patent: Aug. 19, 2014

(54) FLASH MEMORY SYSTEM AND WORD LINE INTERLEAVING METHOD THEREOF

(75) Inventors: Yongjune Kim, Seoul (KR); Hong Rak Son, Anyang-si (KR); Seonghyeog Choi, Hwaseong-si (KR); Junjin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 304 days.

(21) Appl. No.: 13/236,176

(22) Filed: Sep. 19, 2011

(65) Prior Publication Data
US 2012/0069664 A1 Mar. 22, 2012

(30) Foreign Application Priority Data
Sep. 20, 2010 (KR) .................. 10-2010-0092586

(51) Int. Cl.
*G11C 11/06* (2006.01)
(52) U.S. Cl.
USPC .................................................... 365/185.09
(58) Field of Classification Search
USPC .................................... 365/201, 185.09
See application file for complete search history.

(56) References Cited

U.S. PATENT DOCUMENTS

| | | | |
|---|---|---|---|
| 7,051,171 B1 | 5/2006 | Liu et al. | |
| 7,366,962 B2 | 4/2008 | Tanoue | |
| 2005/0180248 A1* | 8/2005 | Scheuerlein | 365/230.03 |
| 2006/0184723 A1* | 8/2006 | Sinclair et al. | 711/103 |
| 2009/0316490 A1* | 12/2009 | Takada | 365/185.26 |
| 2010/0238705 A1* | 9/2010 | Kim et al. | 365/148 |

FOREIGN PATENT DOCUMENTS

| | | |
|---|---|---|
| JP | 2009-266281 A | 11/2009 |
| KR | 10-2009-0122063 A | 11/2009 |

* cited by examiner

*Primary Examiner* — Anthan Tran
(74) *Attorney, Agent, or Firm* — Lee & Morse, P.C.

(57) ABSTRACT

Provided are a flash memory system and a word line interleaving method thereof. The flash memory system includes a memory cell array, and a word line interleaving logic. The memory cell array is connected to a plurality of word lines. The word line (WL) interleaving logic performs an interleaving operation on WL data corresponding to at least two different wordlines and programming data, including the interleaved data, to the memory cell array.

34 Claims, 22 Drawing Sheets

FLASH MEMORY SYSTEM AND WORD LINE INTERLEAVING METHOD THEREOF

CROSS-REFERENCE TO RELATED APPLICATIONS

This U.S. non-provisional patent application claims priority under 35 U.S.C. §119 of Korean Patent Application No. 10-2010-0092586, filed on Sep. 20, 2010, the entire contents of which are hereby incorporated by reference.

BACKGROUND

The present disclosure herein relates to a memory system including a semiconductor memory device, and more particularly, to a flash memory system performing an interleaving operation.

Typically, semiconductor memory devices are classified into volatile memories such as Dynamic Random Access Memories (DRAMs) and Static Random Access Memories (SRAMs) and nonvolatile memories such as Electrically Erasable Programmable Read-Only Memories (EEPROMs), Ferroelectric Random Access Memories (FRAMs), Phase change Random Access Memories (PRAMs), Magnetoresistive Random Access Memories (MRAMs) and flash memories. Nonvolatile memories lose stored data when power supply is stopped, but nonvolatile memories retain stored data even when power supply is stopped. Particularly, flash memories have advantages of high programming speed, low power consumption, and large-capacity data storage. Accordingly, flash memory systems including flash memories are being widely used as data storage media.

In order to meet excellent performance and low price demanded by consumers, it is required to increase the degree of integration of flash memories. However, there is a limitation in increasing the degree of integration on the manufacturing process of typical two-dimensional flash memories. To overcome such a limitation, three-dimensional flash memories have been proposed. Three-dimensional flash memories are manufactured by vertically stacking multiple layers and forming channel holes. However, it is very difficult to uniformly form channel holes in the three-dimensional flash memories. If the section of the channel hole of the three-dimensional flash memory is not uniform, the frequency of bit error occurrence may be changed between different word lines. Such bit error imbalance also may be an issue for two-dimensional flash memories.

SUMMARY

The present disclosure provides a flash memory system and an operating method thereof, which can reduce imbalance of the Bit Error Rate (BER).

Embodiments of the inventive concept may provide methods of operating a memory having a memory cell array, memory cells in the memory cell array having varying cell conditions, and a plurality of wordlines coupled to memory cells along one direction of the array. The method may include interleaving data for at least two different wordlines and programming data, including the interleaved data, to the memory cell array.

In some embodiments, ECC encoding of data may be performed before interleaving data.

In some embodiments, interleaving data for at least two different wordlines may include interleaving data for all wordlines of the memory cell array.

In some embodiments, the memory cell array may include a plurality of memory blocks, the plurality of memory blocks including a plurality of planes connected by word lines and separated by selection lines.

In some embodiments, interleaving data from at least two different wordlines may include interleaving data for different wordlines of a same plane.

In some embodiments, interleaving data from at least two different wordlines may include interleaving data for all wordlines of a same plane.

In some embodiments, interleaving data from at least two different wordlines may include interleaving data for a same wordline in different planes.

In some embodiments, interleaving data for at least two different wordlines may include interleaving data for different wordlines within a plane across different planes.

In some embodiments, each memory cell may be a stacked memory cell, a width of a stacked memory cell may increase along a stacking direction of the plurality of memory cells, and each wordline may be coupled to memory cells along a direction orthogonal to the stacking direction.

In some embodiments, the method may further include determining a size of word line data to be interleaved.

In some embodiments, interleaved data may have a bit error rate equal to an average of the bit error rate of the at least two wordlines.

In some embodiments, the memory cell array may be a two-dimensional array.

In some embodiments, the memory cell array may be a three-dimensional array.

In some embodiments, the memory cell array may be a flash memory cell array.

Embodiments of the inventive concept may provide memory systems including a memory device having a memory cell array with an array of memory cells and a plurality of wordlines, each wordline being coupled to memory cells along a direction of the array, a wordline interleaver configured to interleave data for at least two different wordlines, and a memory controller configured to program data, including the interleaved data, to the memory cell array.

In some embodiments, the wordline interleaver may be part of the memory device.

In some embodiments, the wordline interleaver may be part of the memory controller.

In some embodiments, the memory device and the memory controller may be part of a storage device.

In some embodiments, the wordline interleaver may be part of the storage device.

In some embodiments, the storage device may be part of a memory card.

In some embodiments, the storage device may be part of a solid state device.

In some embodiments, the memory system may include a host to which the storage device is to communicate.

In some embodiments, the wordline interleaver may be in the host.

In some embodiments, the wordline interleaver may be configured to determine a size of word line data to be interleaved.

In some embodiments, interleaved data may have a bit error rate equal to an average of the bit error rate of the at least two wordlines.

In some embodiments, the memory cell array may be a two-dimensional array.

In some embodiments, the memory cell array may be a three-dimensional array.

In some embodiments, each memory cell may be a stacked memory cell, a width of a stacked memory cell may increase along a stacking direction of the plurality of memory cells, and wherein each wordline may be coupled to memory cells along a direction orthogonal to the stacking direction.

In some embodiments, the memory system may include an ECC decoder.

In some embodiments, the wordline interleaver may be configured to interleave data for all wordlines of the memory cell array.

In some embodiments, the memory cell array may include a plurality of memory blocks, the plurality of memory blocks including a plurality of planes connected by word lines and separated by selection lines.

In some embodiments, the wordline interleaver may be configured to interleave data for different wordlines of a same plane.

In some embodiments, the wordline interleaver may be configured to interleave data for all wordlines of a same plane.

In some embodiments, the wordline interleaver may be configured to interleave data for a same wordline in different planes.

In some embodiments, the wordline interleaver may be configured to interleave data for different wordlines within a plane across different planes.

In some embodiments, the memory cell array may be a flash memory cell array.

Embodiments of the inventive concept may provide electronic devices that include the memory system in accordance with embodiments.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

I. Flash Memory System

Figure 1:
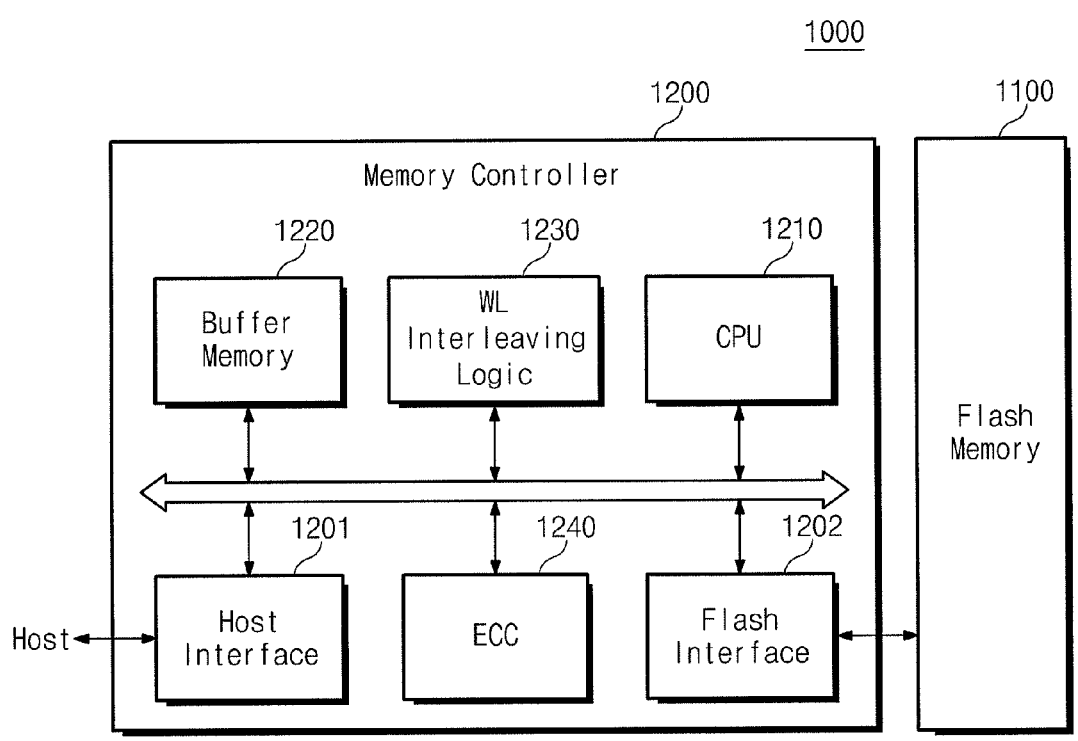
FIG. 1 is a block diagram illustrating a flash memory system according to an embodiment of the inventive concept.

FIG. 1 is a block diagram illustrating a flash memory system according to an embodiment of the inventive concept. Referring to FIG. 1, a flash memory system 1000 may include a host (not shown), a flash memory 1100, and a memory controller 1200. The flash memory 1100 and the memory controller 1200 may be implemented in storage devices such as USB memories, memory cards, and Solid State Drives (SSDs). Such storage devices may be connected to a host such as a computer, a notebook, a digital computer, and a mobile phone to be used.

The flash memory 1100 may perform a write, read, or erase operation according to the control of the memory controller 1200. To do these operations, the flash memory 1100 may exchange commands, addresses, data, and control signals with the memory controller 1200. The flash memory 1100 may include a memory cell array (hereinafter, referred to as a 3D cell array) having a three-dimensional structure (or vertical structure).

The memory controller 1200 may include a host interface 1201, a flash interface 1202, a central processing unit (CPU) 1210, a buffer memory 1220, a word line (WL) interleaving logic 1230, and an error correction code (ECC) circuit 1240. The host interface 1201 may be used in exchanging data with a host. The flash interface 1202 may be used in exchanging data with the flash memory 1100. The CPU 1210 may control the write, read, or erase operation of the flash memory 1100.

The buffer memory 1220 may temporarily store data to be programmed or data to be provided to the host. Also, the buffer memory 1220 may also be used to drive firmware such as Flash Translation Layer (FTL). The FTL may be operated by the CPU 1210. The buffer memory shown in FIG. 1 may be exclusively used in performing a word line (WL) interleaving operation. Such a buffer memory 1220 may be implemented in a volatile memory such as DRAM and SRAM and a nonvolatile memory such as PRAM, MRAM, and a flash memory.

The WL interleaving logic 1230 may perform the WL interleaving operation. The WL interleaving operation may signify an operation for mixing data to be stored in different physical pages of the flash memory 1100. Here, the physical page may signify a set of memory cells connected to one word line. One or more logical pages may be stored in one physical page. The logic page may signify a set of data that can be programmed in one physical page at one time.

The WL interleaving logic 1230 may reduce imbalance of bit error rate (BER) between word lines, by mixing data to be stored in different physical pages. The imbalance of BER between word lines may be shown in a three-dimensional flash memory. This will be described in detail with reference to FIGS. 2 through 7. On the other hand, the WL interleaving logic 1230 may be implemented with hardware such as modules, or software such as algorithm or firmware. The algorithm or firmware may be embodied as computer readable codes and/or programs on a computer readable recording medium. The programming method of the nonvolatile memory device using interleaving technology according to some embodiments of the present inventive concept may be embodied by executing the computer program for executing the programming method of the nonvolatile memory device stored in the computer readable recording medium.

The computer readable recording medium is any data storage device that can store data which can be thereafter read by a computer system. More particularly, the computer readable recording medium may be, e.g., a tangible, non-transitory recording medium. Examples of the computer readable recording medium include read-only memory (ROM), random-access memory (RAM), CD-ROMs, magnetic tapes, floppy disks, and optical data storage devices. The program codes for executing a method of upgrading an operation program in an RFID system may be transmitted in the form of carrier waves (such as data transmission through the Internet).

The computer readable recording medium can also be distributed over network coupled computer systems so that the computer readable code is stored and/or executed in a distributed fashion. Also, functional programs, codes, and/or code segments for realizing embodiments can be easily construed by programmers skilled in the art to which the embodiments pertain.

The ECC circuit 1240 may generate parity bits of an error correction code (ECC), using data transmitted to the flash memory 1100. The parity bits may be stored in the flash memory 1100 together with main data. The main data may be stored in a main area of the flash memory 1100, and the parity bits may be stored in a spare area.

The ECC circuit 1240 may detect and correct a bit error of data read from the flash memory 1100, by using the parity bits stored in the flash memory 1100. However, the number of bit errors that the ECC circuit 1240 can correct may be limited. The ECC circuit 1240 can correct bit errors if the number of the detected bit errors falls within a correction capacity, but cannot correct the bit error if the number of the bit errors does not fall within the correction capacity.

Accordingly, when data are stored in different physical pages, the ECC circuit 1240 may determine the correction capacity according to the physical page having the worst BER. For example, when BER is 8, 4, 2, and 1 in WL1 to WL4, respectively, the ECC circuit 1240 may determine the correction capacity according to the BER of WL1. Thus, when there is a BER imbalance between word lines, the ECC circuit 1240 must adjust the correction capacity to the word line having the worst BER.

On the other hand, the BER imbalance may also be generated in a Multi-Level Cell (MLC) flash memory. For example, when a MLC flash memory in which two or more logical pages are stored in one physical page uses gray mapping, BER may increase two-fold whenever the number of logical pages programmed in one physical page increases. If N logical pages are stored in one physical page, BER for N logical pages may become $1:2:2^2: \ldots : 2^{N-1}$. Even in this case, the ECC circuit 1240 must determined the correction capacity according to the N-th logical page having the worst BER.

The flash memory system 1000 shown in FIG. 1 may reduce the BER imbalance between word lines, by performing a WL interleaving operation. If the BER imbalance is reduced, the flash memory system 1000 may reduce the correction capacity of the ECC circuit 1240.

Figure 2:
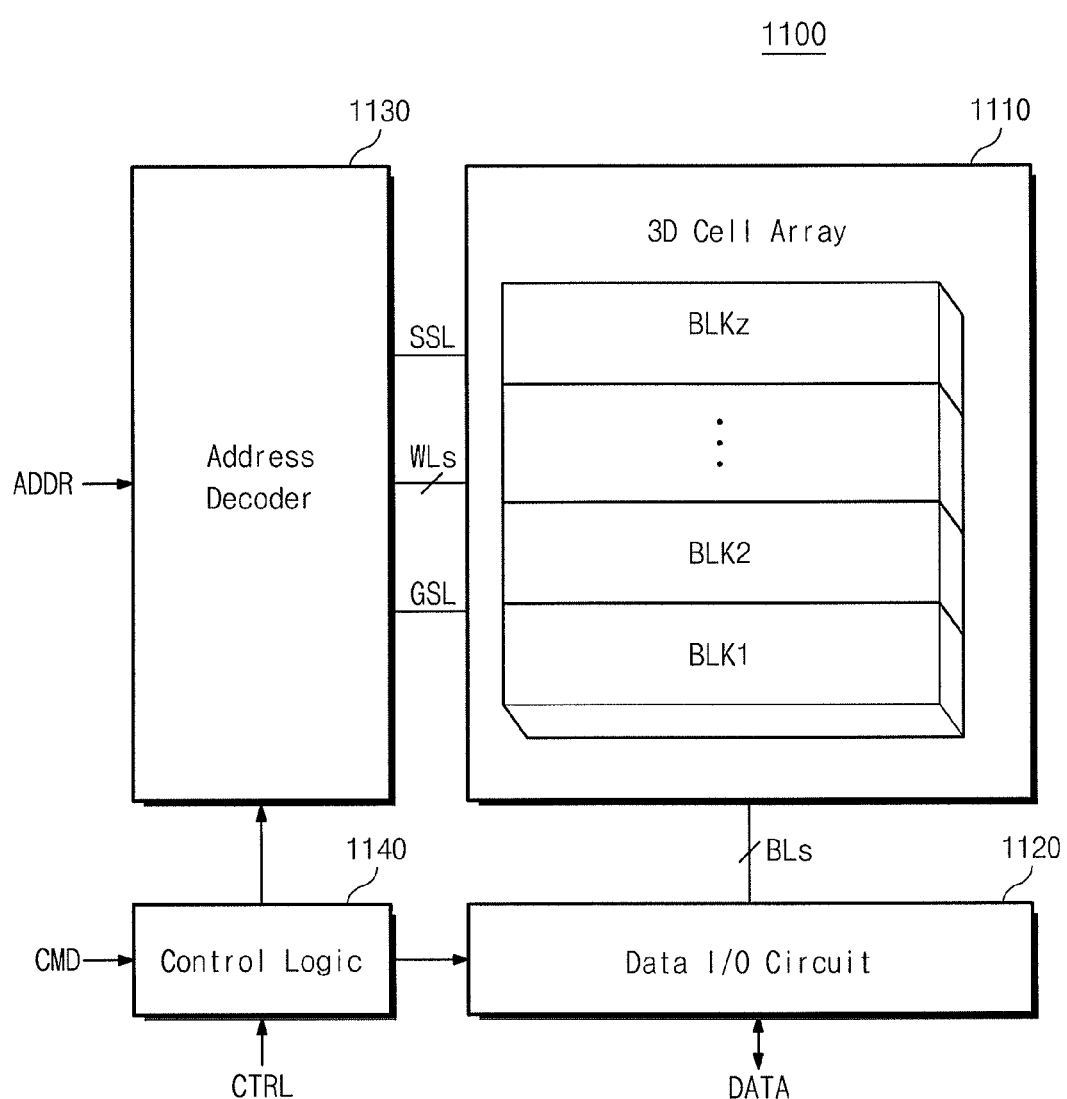
FIG. 2 is a block diagram illustrating an exemplary flash memory of FIG. 1.

FIG. 2 is a block diagram illustrating an exemplary flash memory of FIG. 1.

Referring to FIG. 2, the flash memory 1100 may include a three-dimensional cell array 1110, a date I/O circuit 1120, an address decoder 1130, and a control logic 1140.

The three-dimensional cell array 1110 may include a plurality of memory blocks BLK1 to BLKz. The memory blocks BLK1 to BLKz may have a three-dimensional structure (or vertical structure), respectively. In a memory block having a two-dimensional structure (or horizontal structure), memory cells may be formed in a horizontal direction to a substrate. However, in a memory block having a three-dimensional structure, memory cells may be formed in a vertical direction to a substrate. Each of memory blocks may form an erase unit of the flash memory 1100.

The data I/O circuit 1120 may be connected to the three-dimensional cell array 1110 through a plurality of bit lines BLs. The data I/O circuit 1120 may receive data DATA from the outside, or output data DATA read from the three-dimensional cell array 1110 to the outside. The address decoder 1130 may be connected to the three-dimensional cell array 1110 through a plurality of word lines WLs and selection lines GSL and SSL. The address decoder 1130 may receive an address ADDR and select a word line or more.

The control logic 1140 may control program, read, and erase operations of the flash memory 1100. For example, the control logic 1140 may control the address decoder 1130 upon program operation to allow a program voltage to be provided to a selected word line, and may control the data I/O circuit 1120 to allow data to be programmed.

Figure 3:
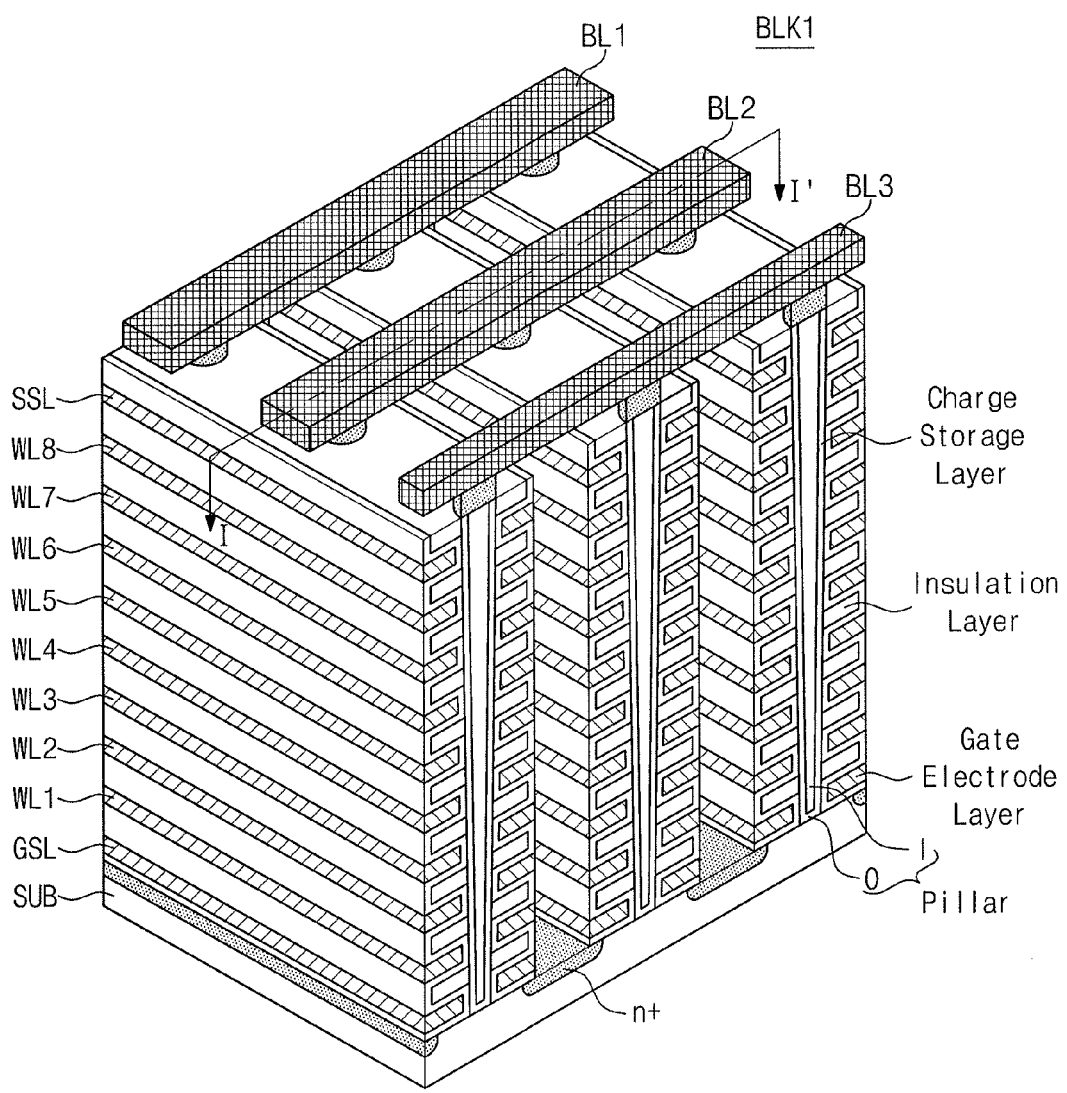
FIG. 3 is a perspective view illustrating an exemplary three-dimensional structure of a memory block (BLK1) of FIG. 2.

FIG. 3 is a perspective view illustrating an exemplary three-dimensional structure of a memory block BLK1 of FIG. 2. Referring to FIG. 3, the memory block BLK1 may be formed in the horizontal direction to a substrate SUB. An n+ doped region may be formed in the substrate SUB. A gate electrode layer and an insulation layer may be alternately deposited on the substrate SUB. Also, a charge storage layer may be formed between the gate electrode layer and the insulation layer.

When the gate electrode layer and the insulation layer are vertically patterned, a V-shaped pillar may be formed. The pillar may penetrate the gate electrode layer and the insulation layer to be connected to the substrate SUB. The outer portion O of the pillar may be configured with a channel semiconductor, and the inner portion I of the pillar may be configured with an insulation material such as silicon oxide.

Referring again to FIG. 3, the gate electrode layer of the memory block BLK1 may be connected to a ground selection line GSL, a plurality of word lines f WL1 to WL8, and a string selection line SSL. The pillar of the memory block BLK1 may be connected to a plurality of bit lines BL1 to BL3. It is illustrated in FIG. 3 that one memory block BLK1 has two selection lines GSL and SSL, eight word lines WL1 to WL8, and three bit lines BL1 to BL3, but embodiments are not limited thereto.

Figure 4:
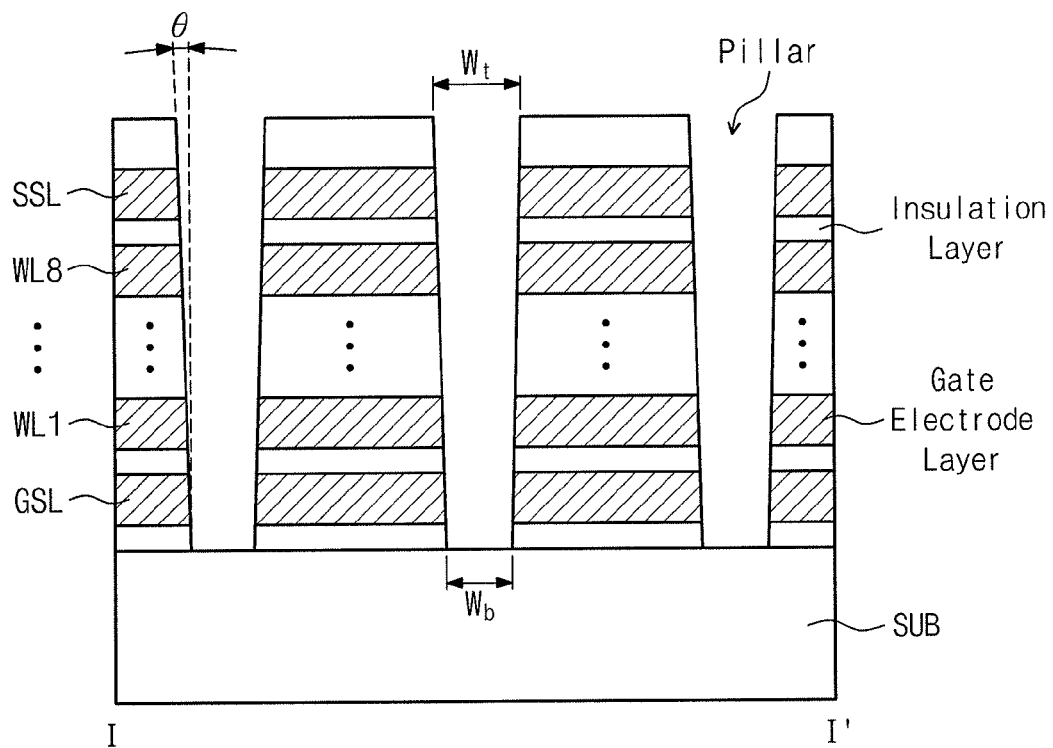
FIG. 4 is a cross-sectional view taken along line I-I' of the memory block (BLK1) of FIG. 3.
Figure 5:
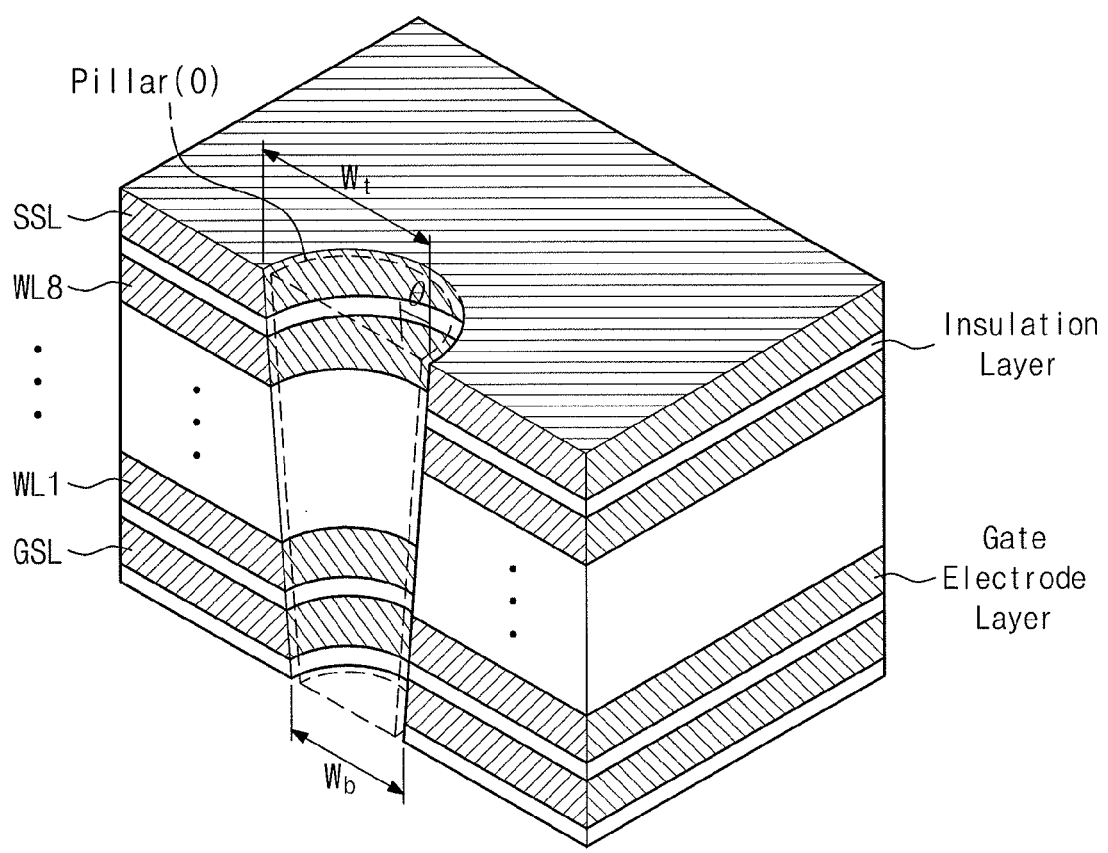
FIGS. 5 and 6 are diagrams illustrating the section of a pillar three-dimensionally.

FIG. 4 is a cross-sectional view taken along line I-I' of the memory block BLK1 of FIG. 3. FIG. 5 is a diagram illustrating the section of a pillar three-dimensionally. Referring to FIGS. 4 and 5, insulation layers and gate electrode layers are alternately stacked in the vertical direction to a substrate SUB. The gate electrode layer may be connected to selection lines GSL and SSL and word lines WL1 to WL8.

Figure 6:
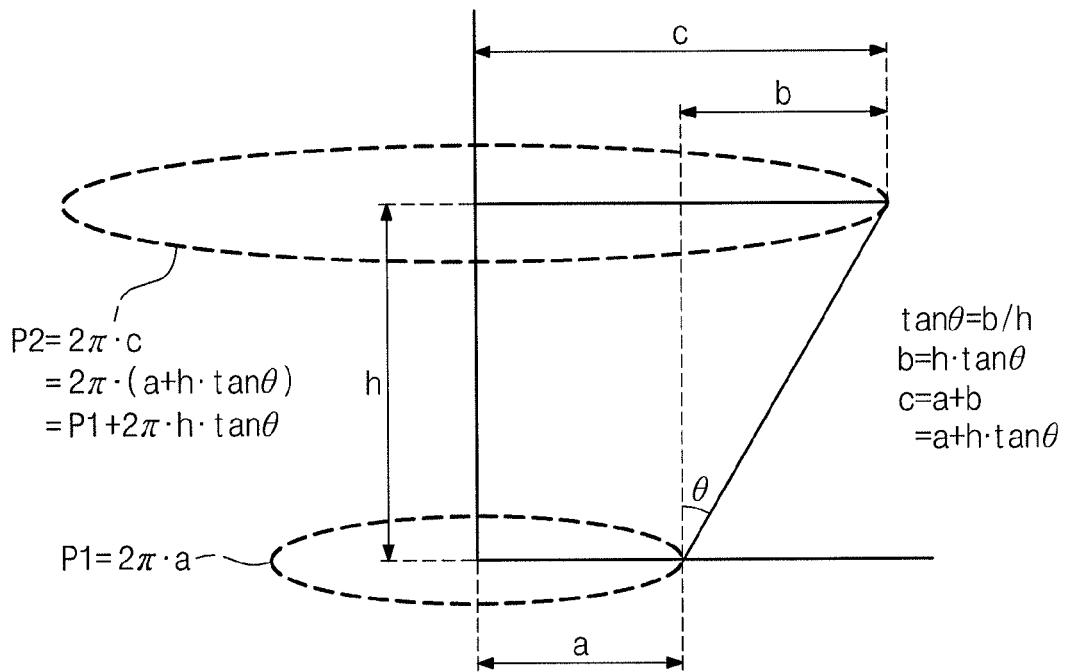

When vertical patterning is performed to form a pillar, the width of the pillar may be reduced as it gets closer to the bottom portion of the pillar (Wt>Wb). Accordingly, the pillar may be a V-shaped cylinder having an inclination angle θ. Due to the width difference of the pillar, the circumference of the pillar may vary according to the inclination angle θ and the height from the substrate SUB. As shown in FIG. 6, when the height between two planes crossing the pillar is h, and the radius of the pillar crossing the lower plane is a, the radius c of the pillar crossing the upper plane can be expressed as Equation (1).

$$c = a + b = a + h^* \tan \theta \quad (1)$$

where * denotes multiplication.

Also, the circumferences P1 and P2 of the pillar crossing the lower and upper planes can be expressed as Equation (2).

$$P1 = 2\pi a$$

$$P2 = 2\pi c = 2\pi(a+b) = 2\pi a + 2\pi h^* \tan \theta = P1 + 2\pi h^* \tan \theta \quad (2)$$

As shown in Equation (2), the circumference of the pillar may vary with the height from the substrate SUB. Accordingly, when the gate electrode layer is formed to have the same thickness, the facing area of the gate electrode layer may vary with the height. Here, the facing area may signify an area of the gate electrode layer facing the outer portion (O of FIG. 5) of the pillar.

The gate electrode layer may be used as a gate electrode of a cell transistor, and the outer portion O of the pillar may be used as a channel region of the cell transistor. In this case, the circumference P1 or P2 of the pillar and the thickness h of the gate electrode layer may determine the aspect ratio (W/L) of the cell transistor. A drain current Id of a MOS transistor may be in proportion to the channel width W and may be in inverse proportion to the channel length L, as shown in Equation (3) below.

$$Id = \alpha \frac{W}{L}(Vg - Vt)Vd \quad (3)$$

where α is a proportionality constant, Vg and Vd are a gate voltage and a drain voltage, respectively, and Vt is a threshold voltage.

Accordingly, cell transistors formed at different heights may have different current characteristics. That is, when the thickness of the gate electrode layer is equal, the current characteristics of the cell transistor may vary according to the height. For this reason, although an equal program or read voltage is applied to the word lines WL1 to WL8, the channel current may vary according to the height of the word line.

This means that the threshold voltage of the cell transistor may vary according to the height of the word line. If the threshold voltage of the cell transistor is changed, BER may be changed according to the word line.

Referring again to FIG. 3, in the memory block BLK1, the width of the pillar may vary according to the height of the word line. For example, the width of the pillar may be reduced as it gets closer to the bottom portion of the pillar. This means that a BER imbalance may be shown between word lines. The flash memory system 1000 shown in FIG. 1 can reduce a BER imbalance between word lines, by performing a WL interleaving operation.

Figure 7:
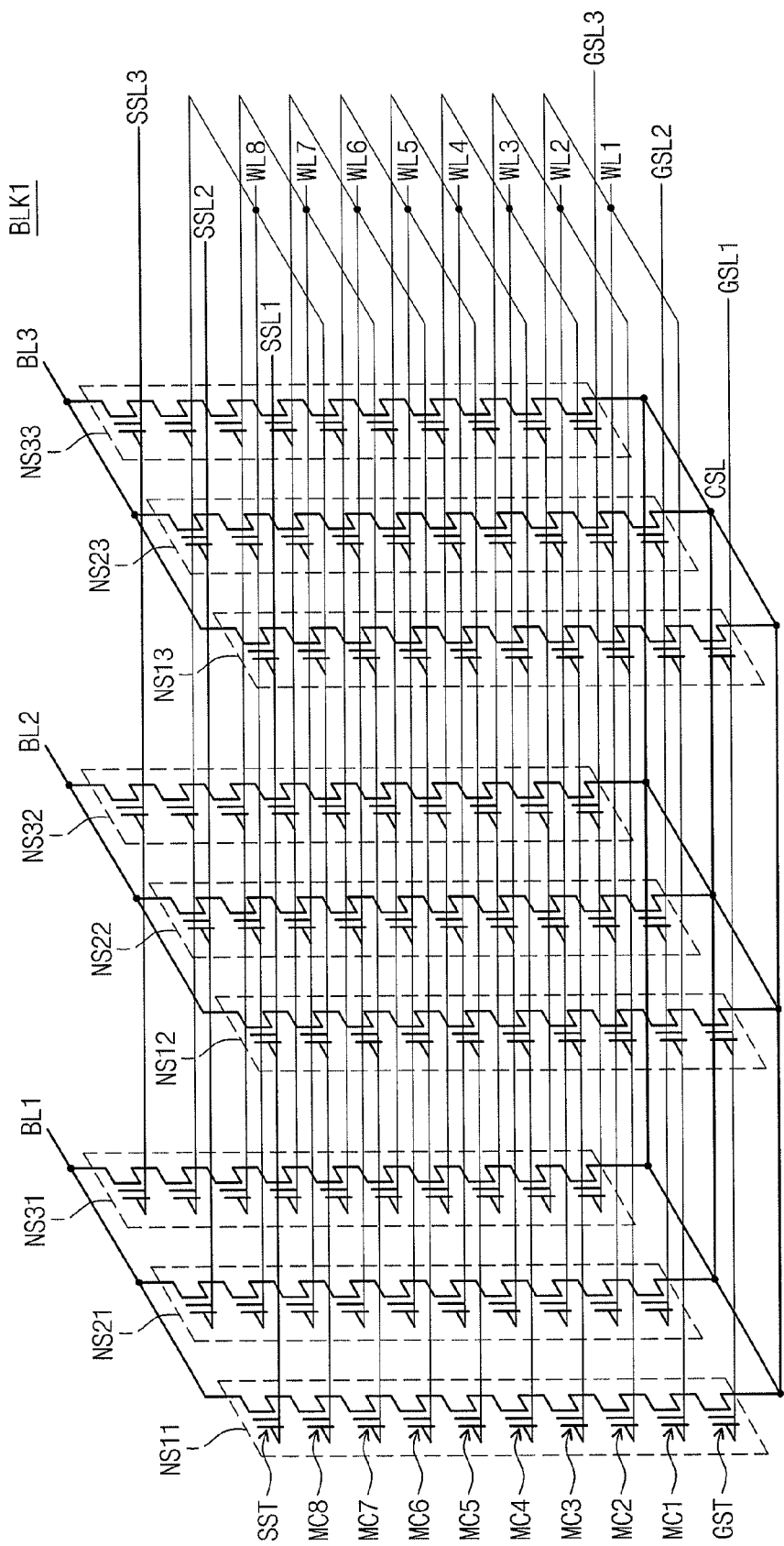
FIG. 7 is an equivalent circuit diagram of the memory block (BLK1) of FIG. 3.

FIG. 7 is an equivalent circuit diagram of the memory block BLK1 of FIG. 3. Referring to FIG. 7, NAND strings NS11 to NS33 may be connected between the bit lines BL1 to BL3 and the common source line CSL. Each NAND string (e.g., NS11) may include a string selection transistor SST, a plurality of memory cells MC1 to MC8, and a ground selection transistor GST.

The string selection transistor SST may be connected to string selection lines SSL1 to SSL3. The plurality of memory cells MC1 to MC8 may be connected to corresponding word lines WL1 to WL8, respectively. The ground selection transistor GST may be connected to ground selection lines GSL1 to GSL3. The string selection transistor SST may be connected to bit line BL, and the ground selection transistor GST may be connected to the common source line CSL.

Referring again to FIG. 7, word lines (e.g., WL1) having the same height may be commonly connected and the ground selection lines GSL1 to GSL3 and the string selection lines SSL1 to SSL3 may be separated. If memory cells (hereinafter, referred to as a page) connected to the first word line WL1 and included in the NAND strings NS11, NS12, and NS13 may be programmed, the first word line WL1 and the first selection lines SSL1 and GSL1 may be selected.

Figure 8:
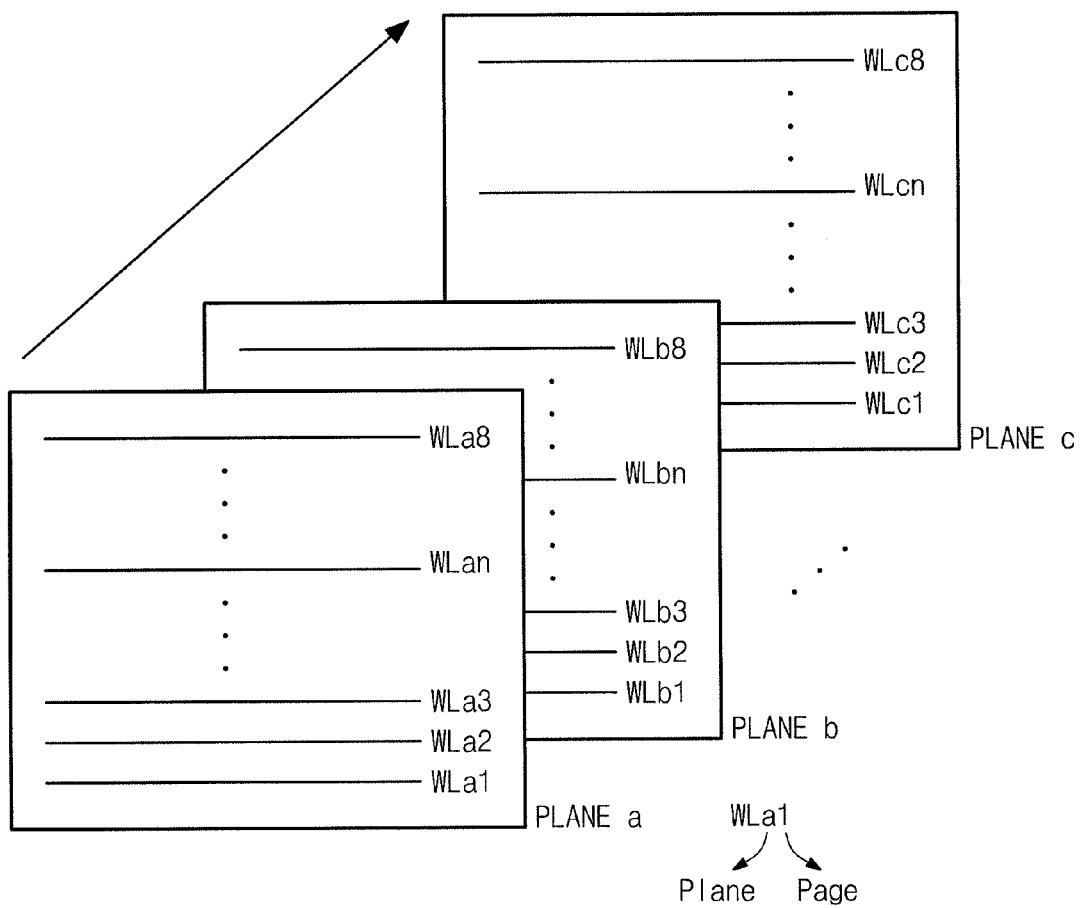
FIG. 8 is a diagram illustrating a plane structure of the equivalent circuit diagram of FIG. 7.

FIG. 8 is a diagram illustrating a plane structure of the equivalent circuit diagram of FIG. 7. Referring to FIG. 8, the memory block BLK1 of FIG. 7 may include three planes. In FIG. 7, the NAND strings NS11, NS12 and NS13 may constitute a plane PLANEa, the NAND strings NS21, NS22 and NS23 may constitute a plane PLANEb, and the NAND strings NS31, NS32 and NS33 may constitute a plane PLANEc. WL1 may be divided into WLa1, WLb1, and WLc1, and WL2 may be divided into WLa2, WLb2, and WLc2. Similarly, WLn may be divided into WLan, WLbn, and WLcn.

The program order may vary. For example, the program operation may be sequentially performed from PLANEa to PLANEc. In each plane, the program operation may be sequentially performed from WL1 to WL8. On the other hand, as shown in FIG. 8, at least one plane may be further included between PLANEb and PLANEc.

The flash memory system (1000 of FIG. 1) according to an embodiment of the inventive concept can reduce a BER imbalance between word lines, by performing a WL interleaving operation. Hereinafter, various WL interleaving methods that can alleviate a BER imbalance between word lines and reduce a burden of the ECC circuit (1240 of FIG. 1) will be described.

II. Embodiments of WL Interleaving Method

1. WL Interleaving Operation Between Different Word Lines of the Same Plane

Figure 9:
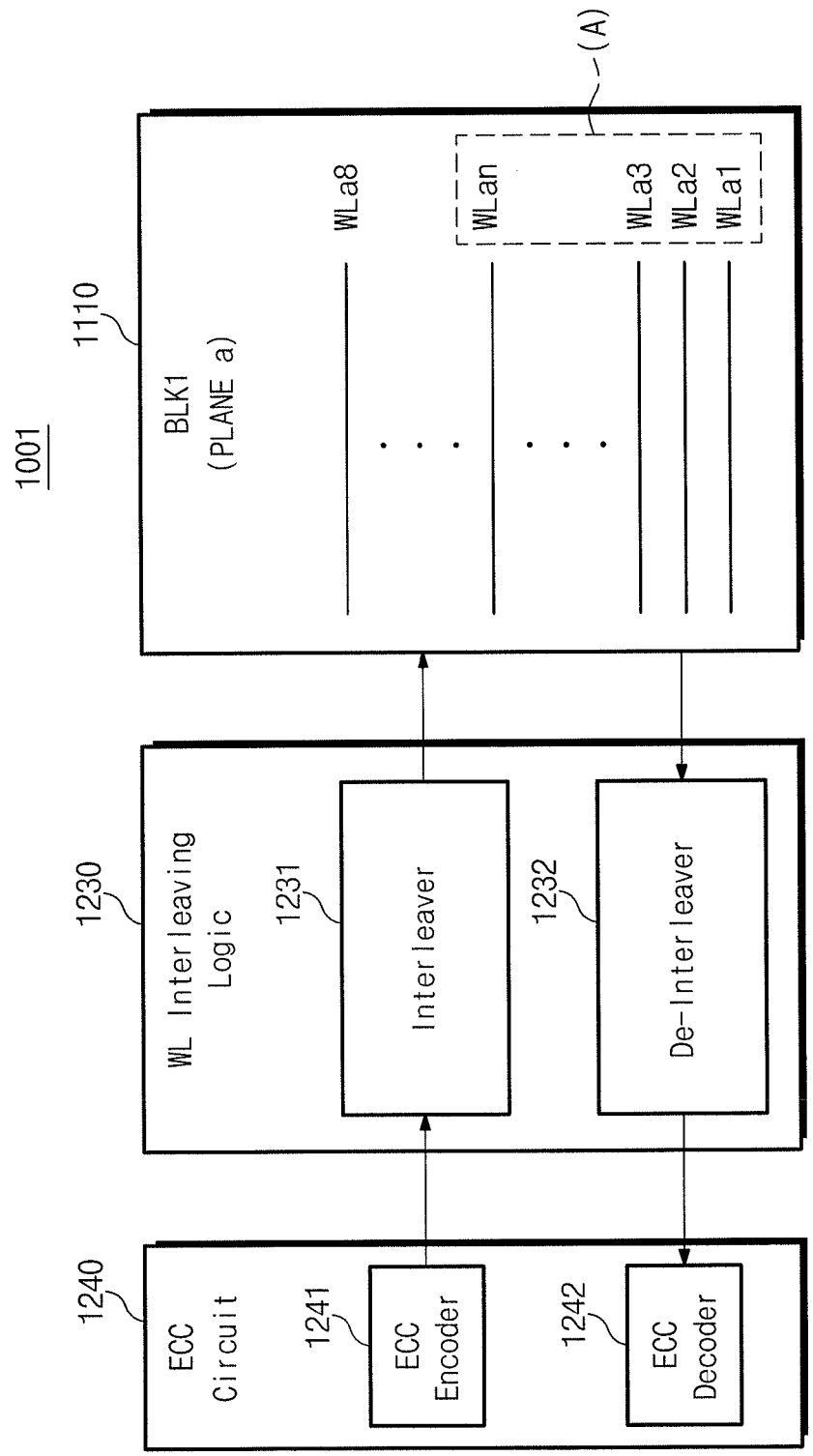
FIG. 9 is a block diagram illustrating a word line (WL) interleaving method of the flash memory system of FIG. 1 according to a first embodiment of the inventive concept.

FIG. 9 is a block diagram illustrating a word line (WL) interleaving method of the flash memory system of FIG. 1 according to a first embodiment of the inventive concept. Referring to FIG. 9, a flash memory system 1001 may include a 3D cell array 1110, a WL interleaving logic 1230, and an ECC circuit 1240. The ECC circuit 1240 may include an ECC encoder 1241 and an ECC decoder 1242. The flash memory system 1001 shown in FIG. 9 may perform an interleaving operation (hereinafter, referred to as a vertical WL interleaving operation) between different word lines of the same plane.

The 3D cell array 1110 may include a plurality of memory blocks. The respective memory block may have a plurality of planes. Referring to FIG. 9, the 3D cell array 1110 may include a first memory block BLK1, and the first memory block BLK1 may include PLANEa. The PLANEa may be connected to WLa1 to WLa8.

The vertical WL interleaving operation may be performed between all word lines WLa1 to WLa8 or some word lines WLai to WLan ($2 \leq i < n \leq 7$) of PLANEa. The vertical WL interleaving operation may also be performed between some word lines (e.g., WLa1, WLa3, WLa4, and WLa7) that are not consecutive. Hereinafter, a partial WL interleaving operation will be described. In FIG. 9, a vertical WL interleaving operation may be performed between some word lines WLa1 to WLan indicated as (A).

The WL interleaving logic 1230 may perform an interleaving operation using an interleaver 1231, and may perform a de-interleaving operation using a de-interleaver 1232.

The ECC circuit 1240 may generate a parity bit of an error correction code (ECC) using the ECC encoder 1241. User data and parity bits may be provided to the interleaver 1231. On the other hand, the ECC circuit 1240 may correct an error of data provided from the de-interleaver 1232 to restore data, by using an ECC decoder 1242. The ECC encoder 1241 or the ECC decoder 1242 may perform an encoding or decoding operation by certain data unit (hereinafter, referred to as code word).

Figure 10:
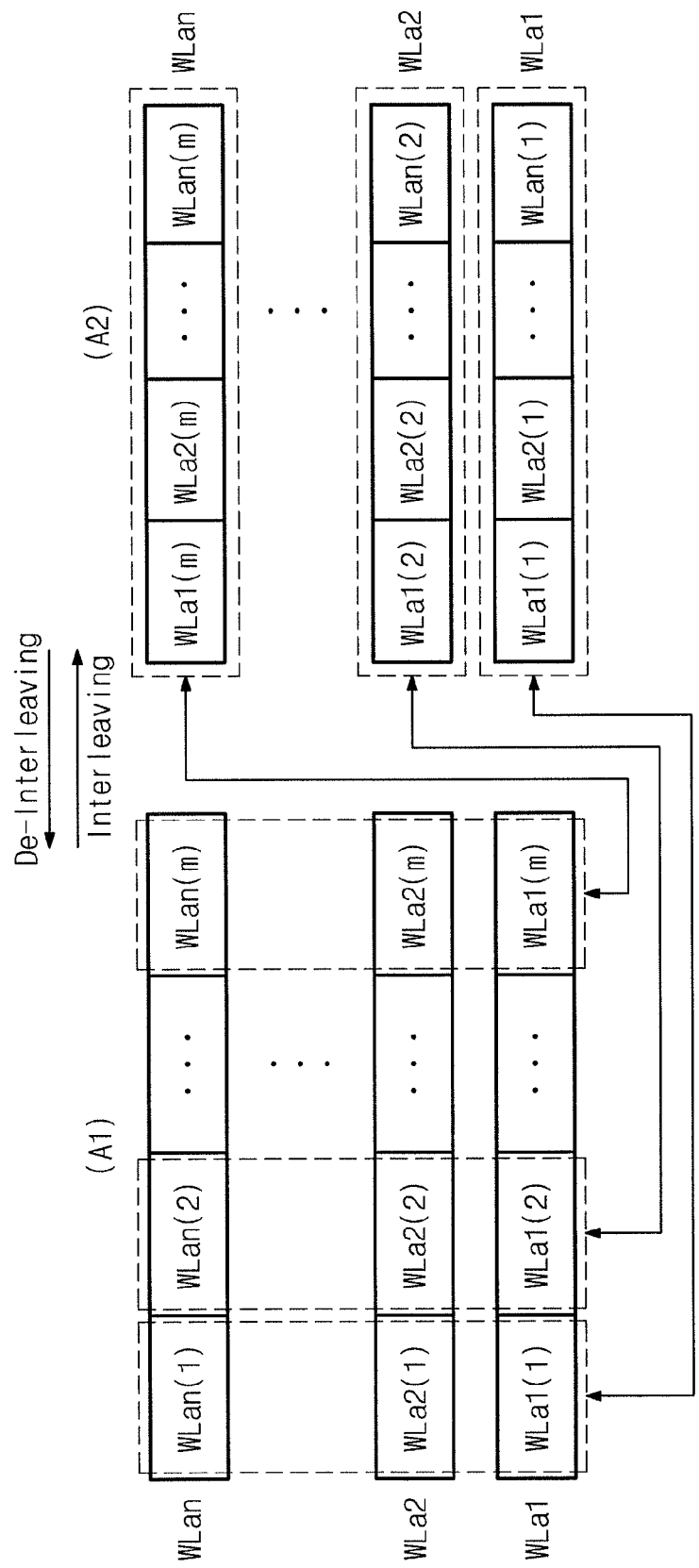
FIG. 10 is a diagram illustrating a WL interleaving operation and a WL de-interleaving operation.

FIG. 10 is a diagram illustrating a WL interleaving operation and a WL de-interleaving operation. Referring to FIG. 10, (A1) indicates a data structure before a WL interleaving operation, and (A2) indicates a data structure after the WL interleaving operation. In WLa1(1), a indicates a plane, 1 indicates a page, and (1) indicates the size of data to which the interleaver 1231 is applied. The size of data to which the interleaver 1231 is applied may be variously adjusted from 1-bit to n-bit (e.g., 8-bit, 512-bit, and 1024-bit).

When the interleaver 1231 is not used, as shown in (A 1) of FIG. 10, data WLa1(1) to WLa1($m$) may be stored in a WLa1 page, data WLa2(1) to WLa2($m$) may be stored in a WLa2 page, and data WLan(1) to WLan(m) may be stored in a WLan page. In this case, BER may vary according to the height of the word line. For example, BER of WLa1 may be worse than BER of WLa2, and BER of WLa2 may be worse than BER of WLan. In this case, the correction capacity of the ECC circuit (1240 of FIG. 9) may be adjusted to WLa1 having the worst BER. This may become a burden of the ECC circuit 1240.

However, when the interleaver 1231 is used, as shown in (A2) of FIG. 10, the data WLa1(1) to WLa1($m$) to be stored in the WLa1 page may be separately stored in the WLa1 to WLan pages. When the de-interleaver 1232 is used to read data, the separately-stored data can be restored to the original state.

Assuming that bit errors get together in the WLa1 page, the bit errors may get together in WLa1(1), WLa2(1), ..., WLan(1) after the interleaver 1231 is applied. Thereafter, when the de-interleaver 1232 is applied, the bit errors may be evenly spread over the WLa1 to WLan pages.

On the other hand, there are various methods for applying the interleaver 1231. As shown in Table 1, the size of data to which the interleaver 1231 is applied may be various starting from 1-bit, and the interleaving operation may be performed by unit of two or more WLs. In Table 1, C1, C2, and so forth may be 1-bit or more data, and the size of data to which the interleaver 1231 is applied. Table 1 shows that the interleaving operation is performed by unit of m word lines.

TABLE 1

| C1 | Cm + 1 |     |       | C1 | Cm + 1 |     |       |     | C1 | Cm + 1 |     |       |
|----|--------|-----|-------|----|--------|-----|-------|-----|----|--------|-----|-------|
| C2 | Cm + 2 |     |       | C2 | Cm + 2 |     |       |     | C2 | Cm + 2 |     |       |
| C3 | Cm + 3 | ... | ...   | C3 | Cm + 3 | ... | ...   | ... | C3 | Cm + 3 | ... | ...   |
| ...| ...    | Cn − 1 |    | ...| ...    | Cn − 1 |    |     | ...| ...    | Cn − 1 |    |
| Cm | C2m    |     |       | Cm | C2m    |     | Cn    |     | Cm | C2m    |     | Cn    |

Methods that use a block interleaver, a convolutional interleaver, and random interleaver in the field of communication may also be applied to embodiments of the inventive concept. Further, an interleaving method according to embodiments of the inventive concept may also be applied to a Multi Level Cell (MLC) flash memory in which 2-bit or higher bit data may be stored in one memory cell.

According to the method shown in FIG. 10, BER may be averaged. For example, assuming that BER is 8, 4, 2, and 1 at WLa1 to WLa4, respectively, BER may be averaged to (8+4+2+1)/4, i.e., 3.75. Since the ECC circuit 1240 adjusts the correction capacity to the average 3.75, the correction capacity may be reduced to that extent. The flash memory system 1001 shown in FIG. 9 may alleviate a BER imbalance between word lines, and reduce the correction capacity of the ECC circuit 1240, by using the vertical WL interleaving operation.

2. WL Interleaving Operation Between the Same Word Line of Different Planes

Figure 11:
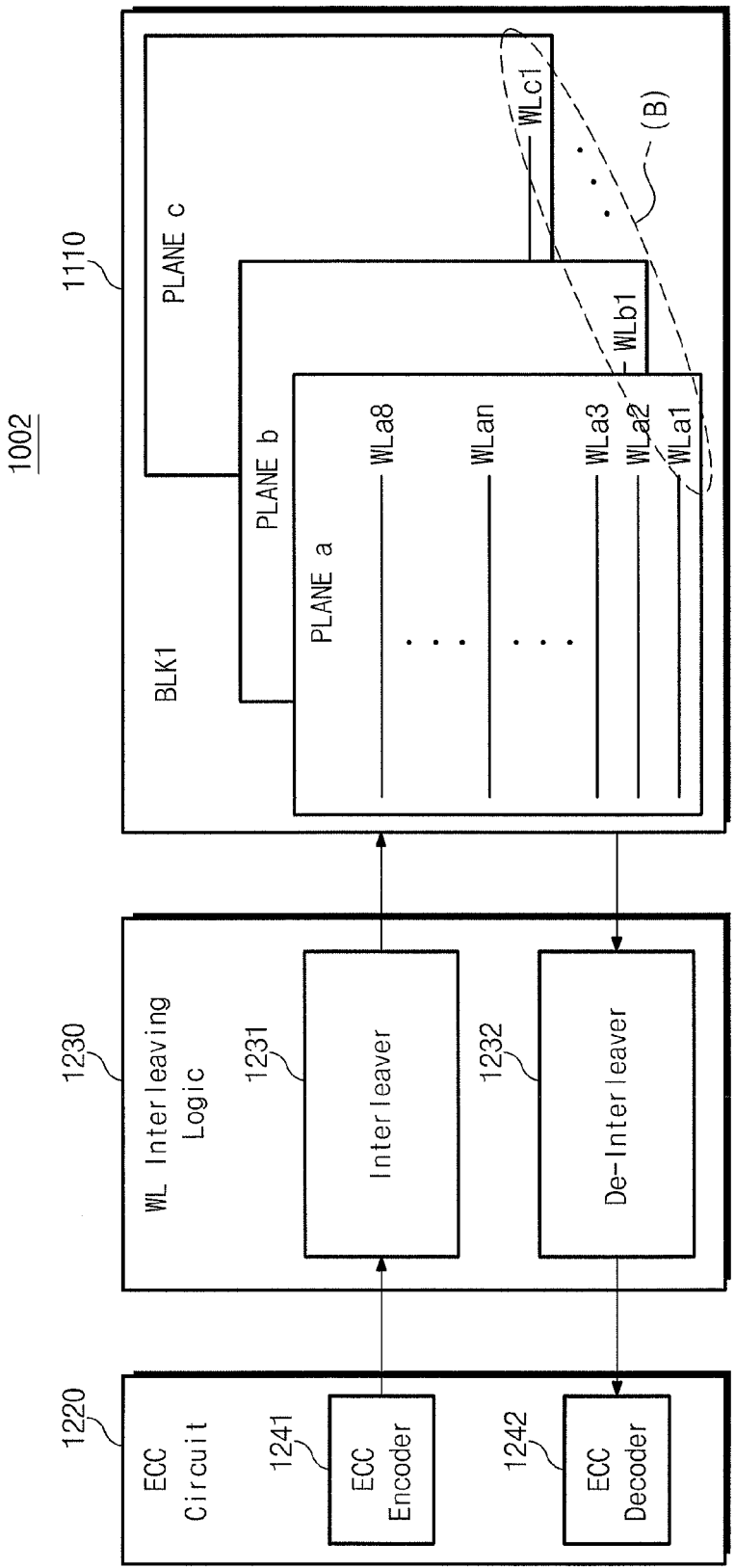
FIG. 11 is a block diagram illustrating a WL interleaving method of the flash memory system of FIG. 1 according to a second embodiment of the inventive concept.

FIG. 11 is a block diagram illustrating a WL interleaving method according to a second embodiment of the inventive concept. Referring to FIG. 11, a flash memory system 1002 may include a 3D cell array 1110, a WL interleaving logic 1230, and an ECC circuit 1240. The ECC circuit 1240 may include an ECC encoder 1241 and an ECC decoder 1242. The flash memory system 1002 shown in FIG. 11 may perform an interleaving operation (hereinafter, referred to as a horizontal WL interleaving operation) between the same word line of different planes.

Referring to FIG. 11, the 3D cell array 1110 may include a first memory block BLK1. The first memory block BLK1 may include PLANEa to PLANEc. PLANEa may be connected to WLa1 to WLa8. PLANEb may be connected to WLb1 to WLb8. PLANEc may be connected to WLc1 to WLc8. Here, WLa1, WLb1 and WLc1 of different planes may be commonly connected to the same word line WL1. The horizontal WL interleaving operation may be performed between the same word line WLa1, WLb1 and WLc1 indicated as (B). On the other hand, the horizontal WL interleaving operation may also be performed between the same word line (e.g., WLa1 and WLc1) that are not consecutive.

Figure 12:
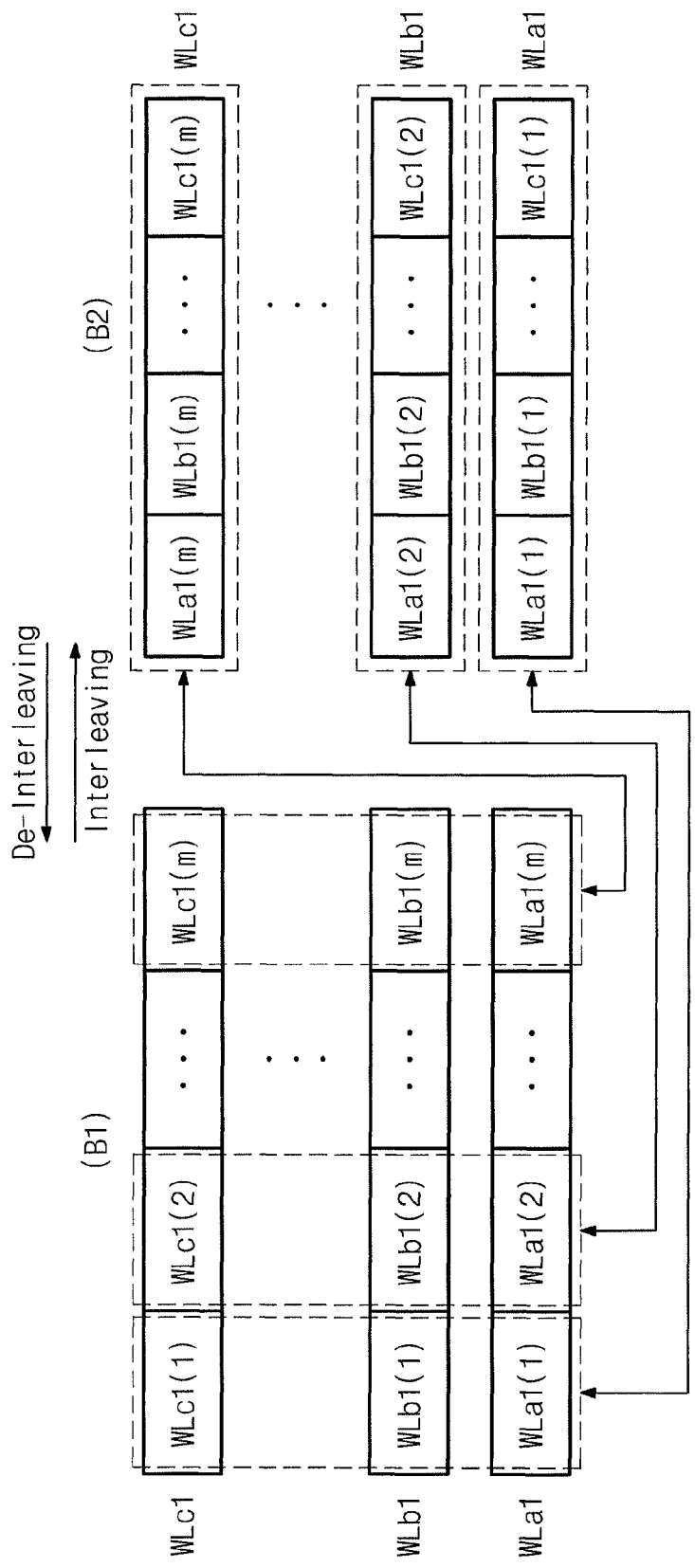
FIG. 12 is a diagram illustrating a WL interleaving operation and a WL de-interleaving operation of the flash memory system shown in FIG. 11.

FIG. 12 is a diagram illustrating an exemplary WL interleaving operation and WL de-interleaving operation of the flash memory system 1002 shown in FIG. 11. In FIG. 12, (B1)

shows a data structure before the WL interleaving operation, and (B2) shows a data structure after the WL interleaving operation.

When the interleaver 1231 is not used, as shown in (B1) of FIG. 12, data WLa1(1) to WLa1(m) may be stored in a WLa1 page of PLANEa, data WLb1(1) to WLb1(m) may be stored in a WLb1 page of PLANEb, and data WLc1(1) to WLc1(m) may be stored in a WLc1 page of PLANEc.

On the other hand, despite of a page connected to the same word line WL1, BER may vary according to the plane. For example, BER of WLa1 may be worse than BER of WLb1, and BER of WLb1 may be worse than BER of WLc1. In this case, the correction capacity of the ECC circuit (1240 of FIG. 11) may be adjusted to WLa1 having the worst BER. This may become a burden of the ECC circuit 1240.

When the interleaver 1231 is used, as shown in (B2) of FIG. 12, data WLa1(1) to WLa1(m) to be stored in a WLa1 page may be separately stored in the WLa1, WLb1, ..., WLc1 pages. When the de-interleaver 1232 is used to read data, the separately-stored data may be restored to the original state.

Assuming that bit errors get together in the WLa1 page, the bit errors may get together in WLa1(1), WLb1(1), ..., WLc1(1) after the interleaver 1231 is applied. Thereafter, when the de-interleaver 1232 is applied, the bit errors may be evenly spread over the WLa1 to WLc1 pages.

According to the method shown in FIG. 12, BER may be averaged. For example, assuming that BER is 3, 2, and 1 at WLa1 to WLc1, respectively, BER may be averaged to (3+2+1)/3, i.e., 2. Since the ECC circuit 1240 adjusts the correction capacity to the average 2, the correction capacity may be reduced to that extent. The flash memory system 1002 shown in FIG. 11 may alleviate a BER imbalance between the same word lines different planes, and reduce the correction capacity of the ECC circuit 1240, by using the horizontal WL interleaving operation.

3. WL Interleaving Method Between Different Word Lines of Different Planes

Figure 13:
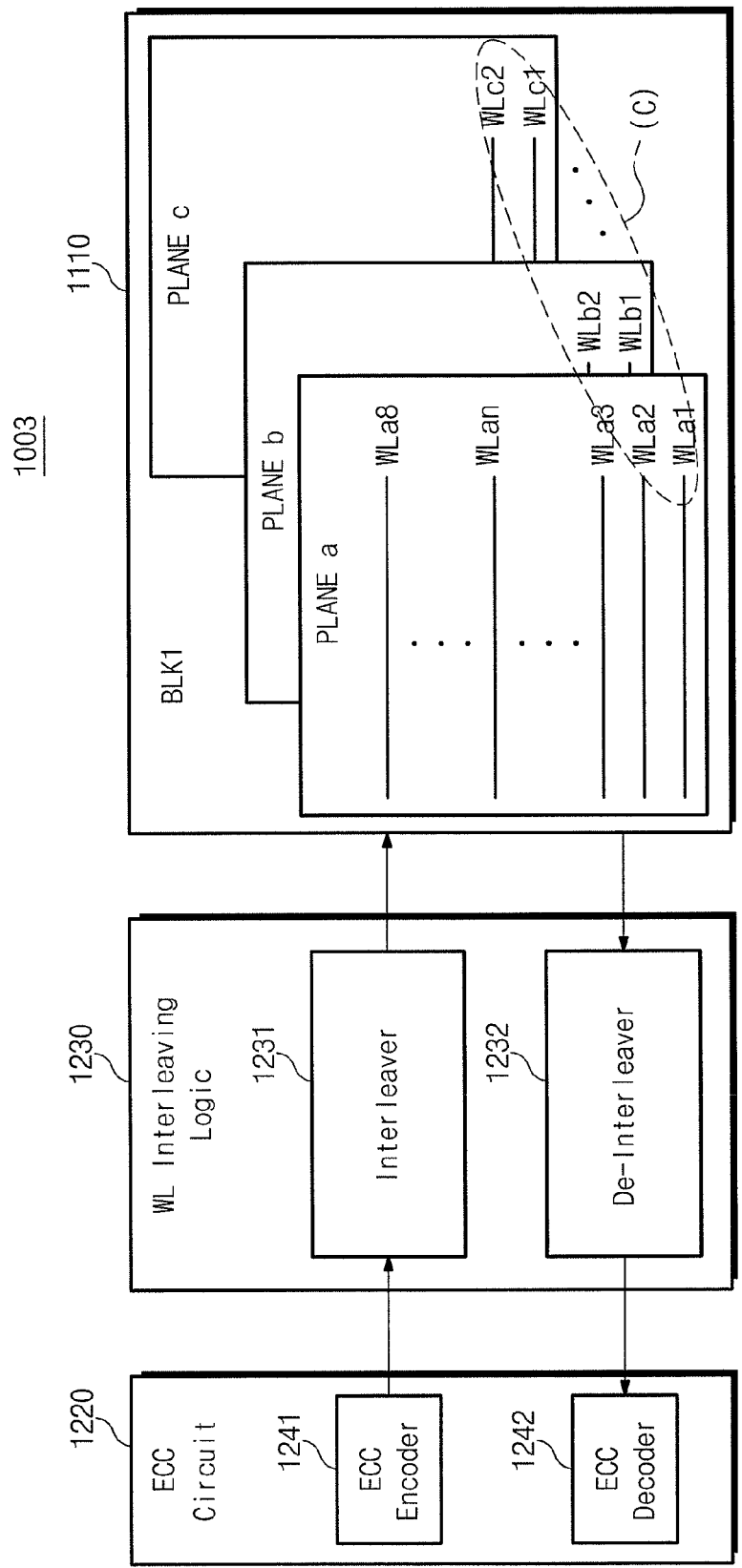
FIG. 13 is a block diagram illustrating a WL interleaving method of the flash memory system of FIG. 1 according to a third embodiment of the inventive concept.

FIG. 13 is a block diagram illustrating a WL interleaving method of the flash memory system of FIG. 1 according to a third embodiment of the inventive concept. Referring to FIG. 13, a flash memory system 1003 may include a 3D cell array 1110, a WL interleaving logic 1230, and an ECC circuit 1240. The ECC circuit 1240 may include an ECC encoder 1241 and an ECC decoder 1242. The flash memory system 1002 shown in FIG. 13 may perform an interleaving operation between different word lines of different planes.

Referring to FIG. 13, the 3D cell array 1110 may include a first memory block BLK1. The first memory block BLK1 may include PLANEa to PLANEc. PLANEa may be connected to WLa1 to WLa8. PLANEb may be connected to WLb1 to WLb8. PLANEc may be connected to WLc1 to WLc8. The WL interleaving operation may be performed between the different word lines WL1 and WL2 of different planes indicated as (C). In FIG. 13, WLa1, WLb1, and WLc1 may be commonly connected to the same word line WL1, and WLa2, WLb2, and WLc2 may be commonly connected to the same word line WL2.

Figure 14:
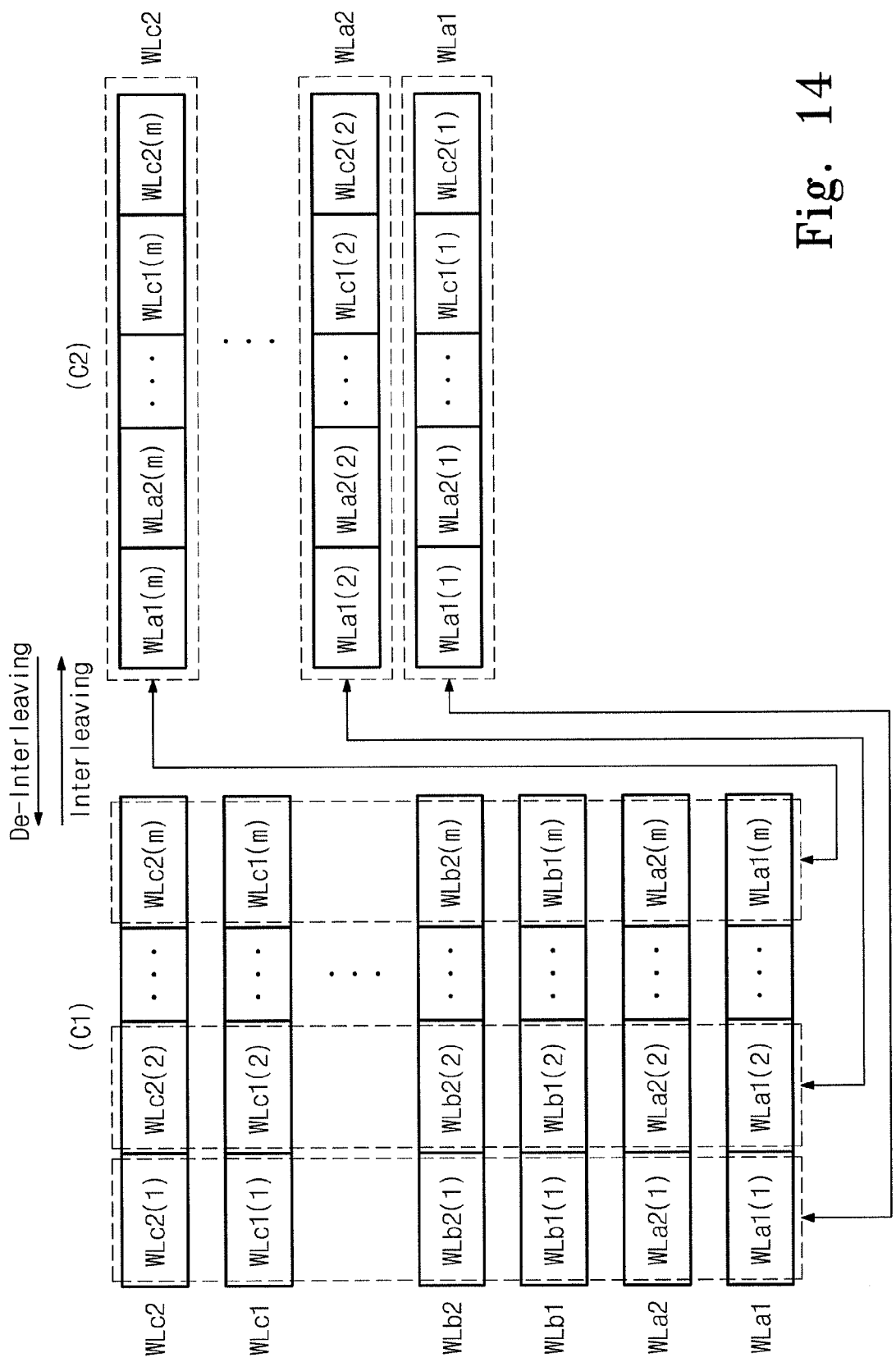
FIG. 14 is a diagram illustrating a WL interleaving operation and a WL de-interleaving operation of the flash memory system shown in FIG. 13.

FIG. 14 is a diagram illustrating an exemplary WL interleaving operation and WL de-interleaving operation of the flash memory system 1003 shown in FIG. 13. In FIG. 14, (C1) shows a data structure before the WL interleaving operation, and (C2) shows a data structure after the WL interleaving operation.

As shown in (C1) of FIG. 14, it is assumed that data WLa1(1) to WLa1(m) and data WLa2(1) to WLa2(m) are stored in WLa1 and WLa2 pages of PLANEa, respectively, data WLb1(1) to WLb1(m) and data WLb2(1) to WLb2(m) are stored in WLb1 and WLb2 pages of PLANEb, respectively, and data WLc1(1) to WLc1(m) and data WLc2(1) to WLc2(m) are stored in WLc1 and WLc2 pages of PLANEc, respectively.

On the other hand, BER may vary according to different planes or different word lines. In this case, the correction capacity of the ECC circuit (1240 of FIG. 13) may be adjusted to WLa1 having the worst BER. This may become a burden of the ECC circuit 1240.

According to the method shown in FIG. 14, BER may be averaged. For example, assuming that BER is 4 and 3 at WLa1 to WLa2, 4 and 2 at WLb1 and WLb2, and 3 and 2 at WLc1 and WLc2, respectively, BER may be averaged to (4+3+4+2+3+2)/6, i.e., 3. Since the ECC circuit 1240 adjusts the correction capacity to the average 2, the correction capacity may be reduced to that extent. The flash memory system 1003 shown in FIG. 13 may alleviate a BER imbalance between different word lines different planes, and reduce the correction capacity of the ECC circuit 1240, by using the WL interleaving operation.

Figure 15:
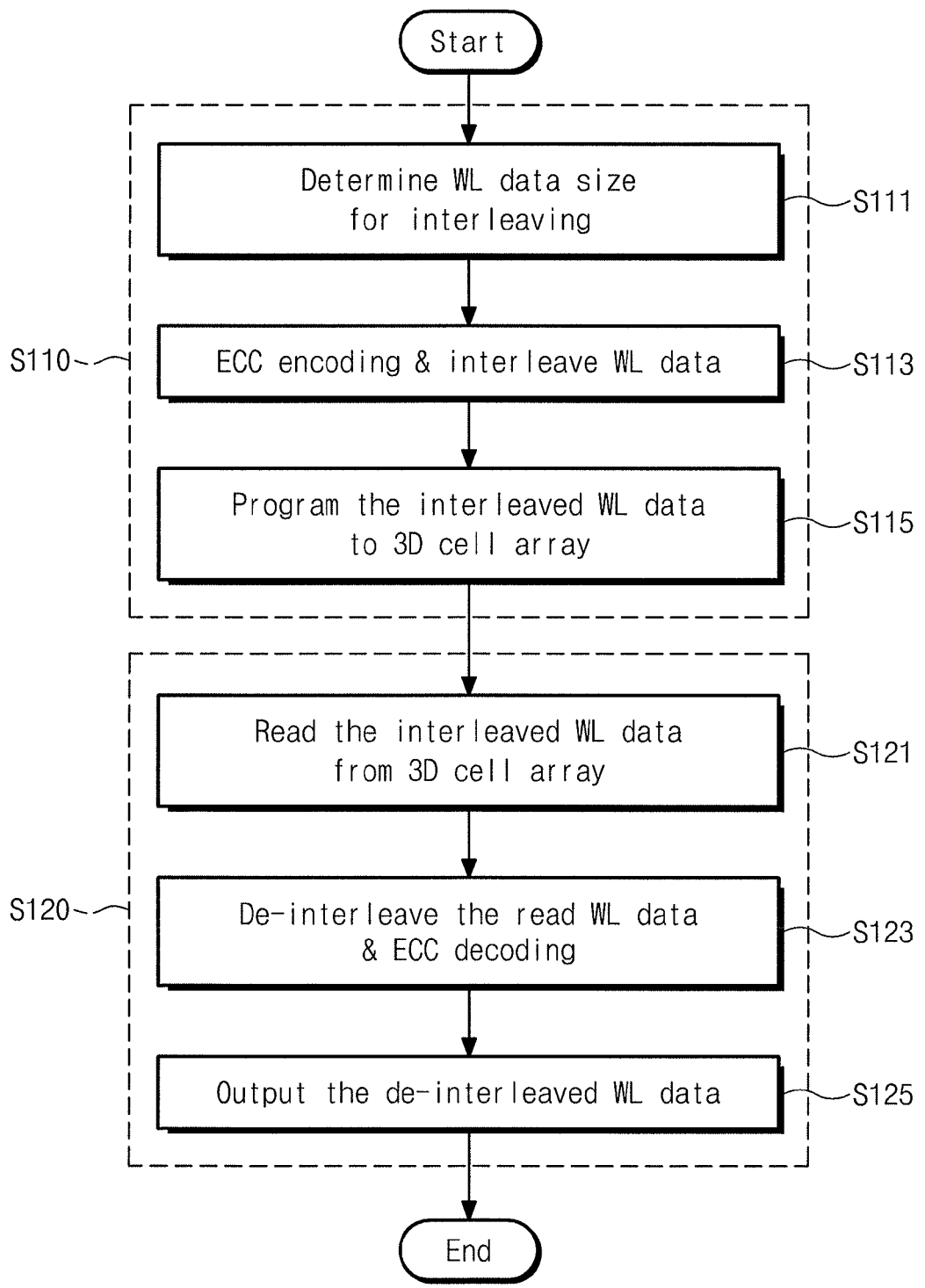
FIG. 15 is a flowchart illustrating a WL interleaving operation of the flash memory system shown in FIG. 1.

FIG. 15 is a flowchart illustrating a WL interleaving operation of the flash memory system 1000 shown in FIG. 1. Referring to FIG. 15, operation S110 concerns a WL interleaving operation, and operation S120 concerns a WL de-interleaving operation.

In operation S110, the WL interleaving operation may progress in the following order. In operation S111, the flash memory system (1000 of FIG. 1) may determine the size of word line data on which an interleaving operation is performed. That is, a plane, a page, and the size of data on which the interleaving operation is performed may be determined. The WL interleaving operation may be performed between different word lines of the same plane, the same word lines of different planes, or different word lines of different planes.

In operation S113, ECC encoding may be performed, and the interleaving operation may be performed by mixing word line data. That is, the interleaving operation may be performed by generating parity bits of an ECC using the ECC circuit (1240 of FIG. 1) and mixing the generated parity bits and the user data.

In operation S115, the interleaved word line data may be programmed in a 3D cell array. The user data may be programmed in a main area, and the parity bits may be programmed in a spare area.

In operation S120, the WL de-interleaving operation may be performed in the following order. In operation S121, the flash memory system 1000 may read the interleaved WL data from the 3D cell array. In operation S123, the read WL data may be de-interleaved, and ECC decoding may be performed. In operation S125, the de-interleaved WL data may be output. Here, the de-interleaved WL data may be original data before performance of the interleaving operation.

BER imbalance between word lines may be reduced by the WL interleaving method of a flash memory system according to an embodiment of the inventive concept. If the BER imbalance is reduced, a burden on the correction capacity of the ECC circuit can be reduced.

Figure 16:
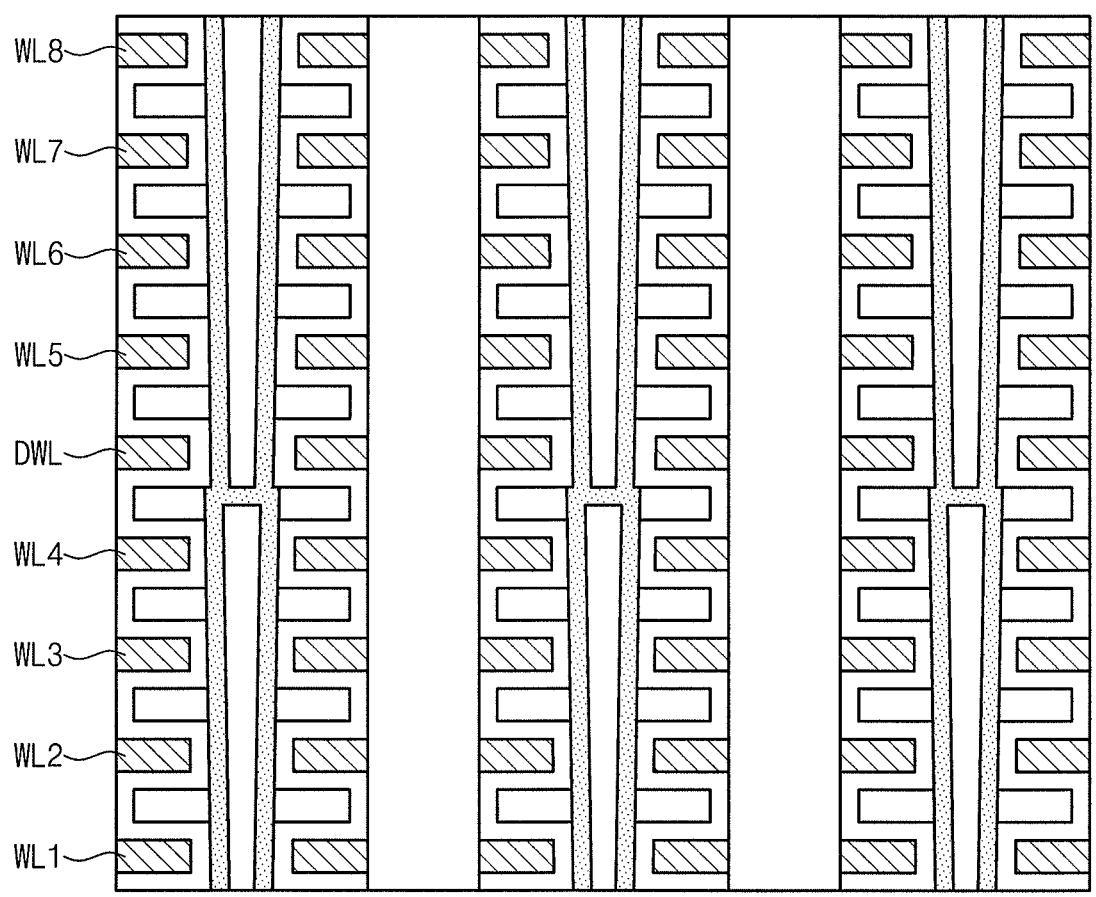
FIG. 16 is a cross-sectional view illustrating a 3D cell array of FIG. 2 according to another embodiment.

On the other hand, the flash memory system and the interleaving method thereof according to an embodiment of the inventive concept may be applied to the case where two or more pillars are formed on a substrate as shown in FIG. 16. Referring to FIG. 16, a dummy word line DWL may exist between fourth and fifth word lines WL4 and WL5.

Also, the inventive concept may be applied to the case where a 2D (horizontal structure) flash memory is vertically formed as shown in FIG. 8. That is, even when PLANEa, PLANEb, and PLANEc of FIG. 8 are 2D flash memories, a burden on the correction capacity of the ECC circuit can be reduced by applying the WL interleaving method.

III. Application of Flash Memory System Using WL Interleaving Method

The memory system according to an embodiment of the inventive concept may be applied to various products. The memory system may be implemented in an electronic device such as a personal computer, a digital camera, a camcorder, a mobile phone, an MP3, a PMP, a PSP, and a PDA, and a storage device such as a memory card, a USB memory, and a solid state drive (SSD).

Figure 17:
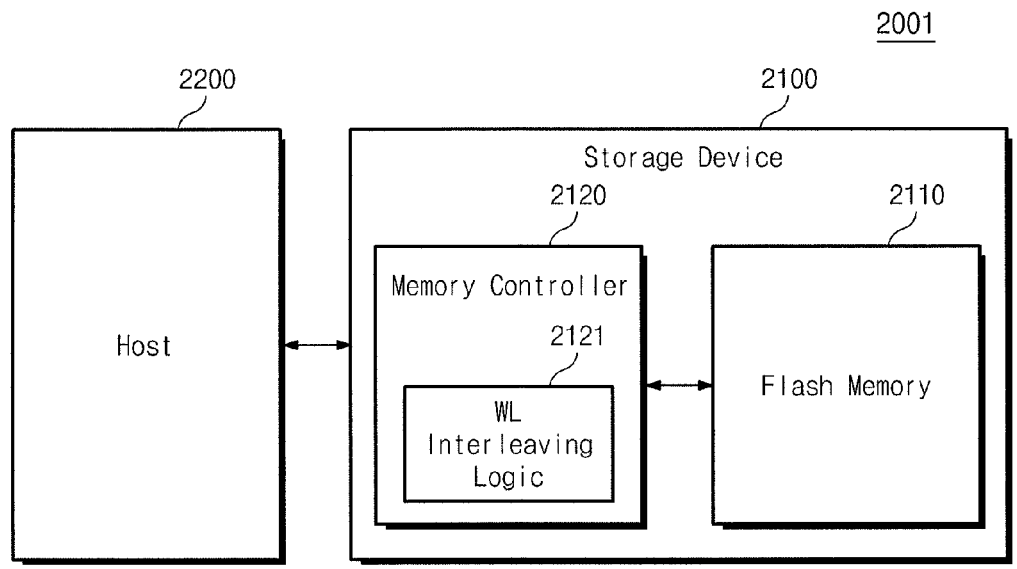
FIGS. 17 through 19 are block diagrams illustrating various applications of a flash memory system according to an embodiment of the inventive concept.
Figure 18:
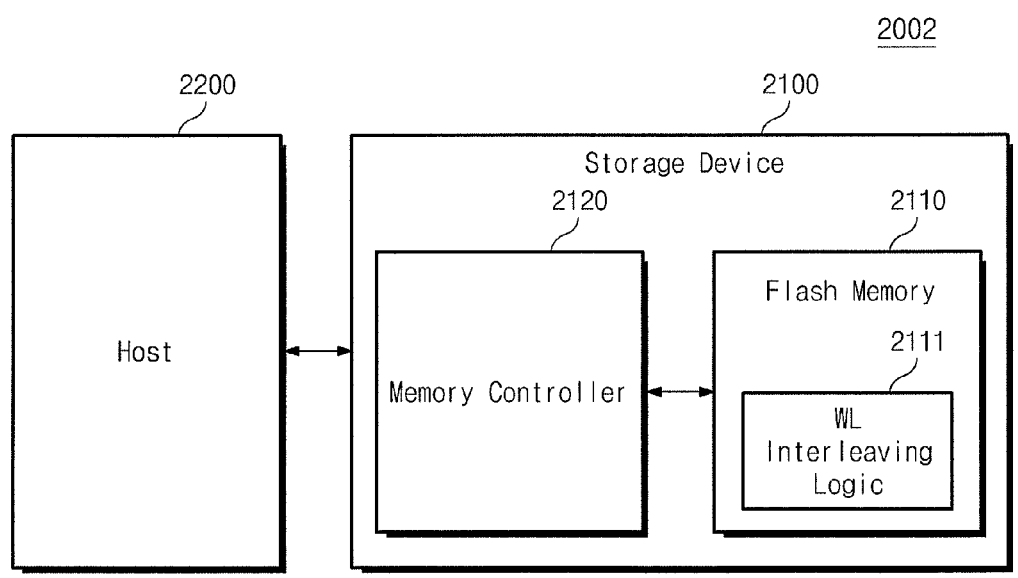
Figure 19:
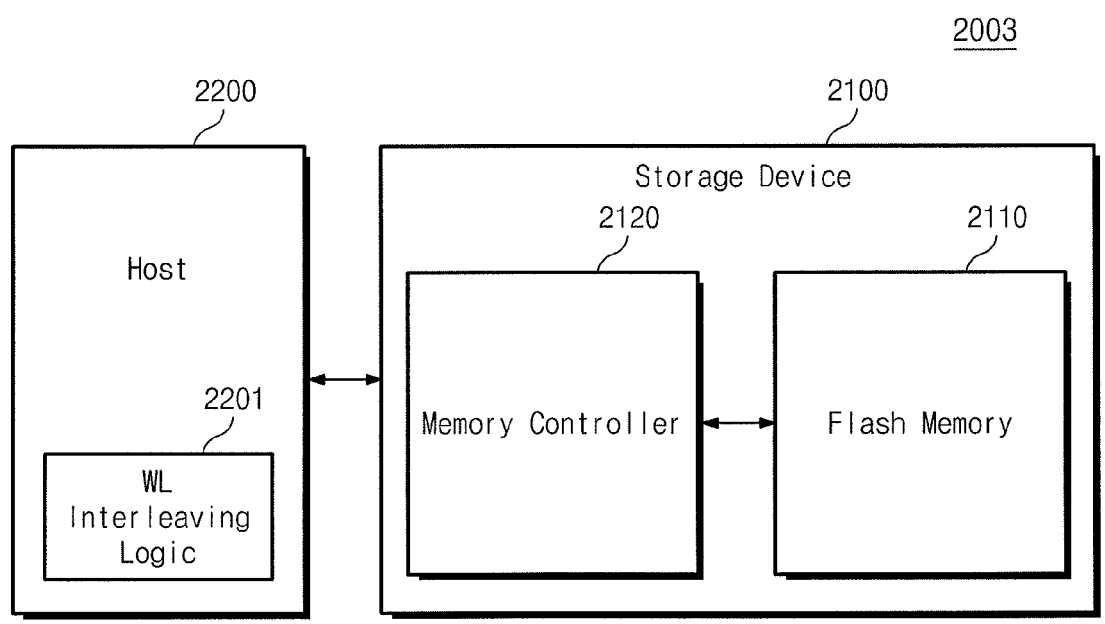

FIGS. 17 through 19 are block diagrams illustrating various applications of a flash memory system according to an embodiment of the inventive concept. Referring to FIGS. 17 through 19, flash memory systems 2001 to 2003 may include a storage device 2100 and a host 2200. The storage device 2100 may include a flash memory 2110 and a memory controller 2120.

The storage device 2100 may include a storage medium such as a memory card (e.g., SD, MMC, and the like), or a portable storage device (e.g., USB memory). The storage device 2100 may be connected to the host 2200. The storage device 2100 may exchange data with the host 2200 through a host interface. The storage device 2100 may receive power from the host 2200 to perform internal operations.

Referring to FIG. 17, a WL interleaving logic 2121 may be included in the memory controller 2120. Referring to FIG. 18, the WL interleaving logic 2111 may be included in the flash memory 2110. Referring to FIG. 19, the WL interleaving logic 2201 may be included in the host 2200. The flash memory systems 2001 to 2003 according to the embodiments of the inventive concept can be reduced BER imbalance between word lines, by using the WL interleaving logic.

Figure 20:
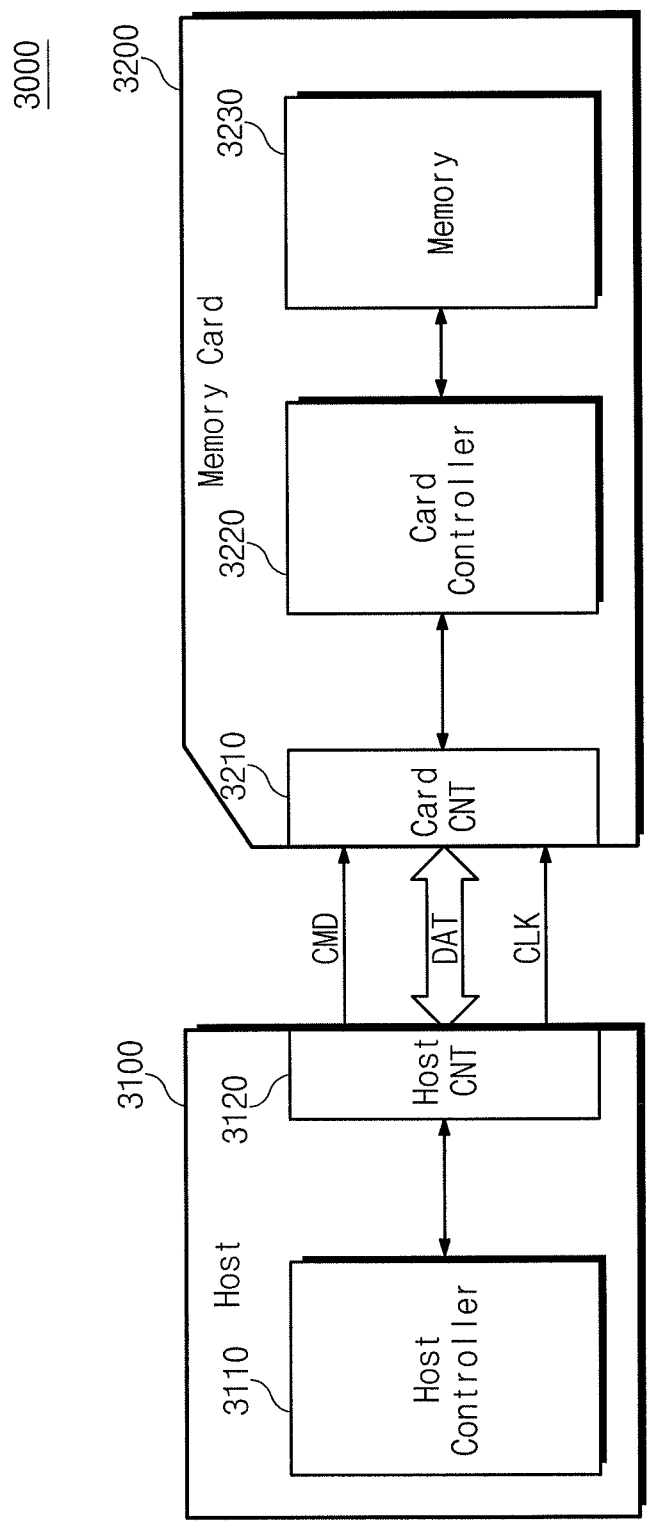
FIG. 20 is a diagram illustrating an exemplary memory card to which a flash memory system according to an embodiment of the inventive concept is applied.

FIG. 20 is a diagram illustrating an exemplary memory card to which a flash memory system according to an embodiment of the inventive concept is applied. A memory card system 3000 may include a host 3100 and a memory card 3200. A host 3100 includes a host controller 3110 and a host connection unit 3120. The memory card 3200 includes a card connection unit 3210, a card controller 3220, and a flash memory 3230. Here, the host controller 2110, the card controller 3220, or the flash memory 3230 may include a WL interleaving logic (not shown) described above.

The host 3100 may write data in the memory card 3200 and may read the data stored in the memory card 3200. The host controller 3110 transmits a command (e.g., a write command), a clock signal CLK generated by a clock generator (not shown) in the host 3100, and data DATA to the memory card 3200 through the host connection unit 3120.

The card controller 3220 stores the data in the flash memory device 3230 in response to the write command received through card connection unit 3210, being synchronized with a clock signal generated by a clock generator (not shown) in the card controller 3220. The flash memory 3230 stores data transmitted from the host 3100. For example, if the host 3100 is a digital camera, the flash memory 3230 stores image data.

The memory card 3200 of FIG. 20 may reduce a BER imbalance between word lines of the flash memory 3230, by using a WL interleaving logic. The WL interleaving method may be in accordance with any of the embodiments described above.

Figure 21:
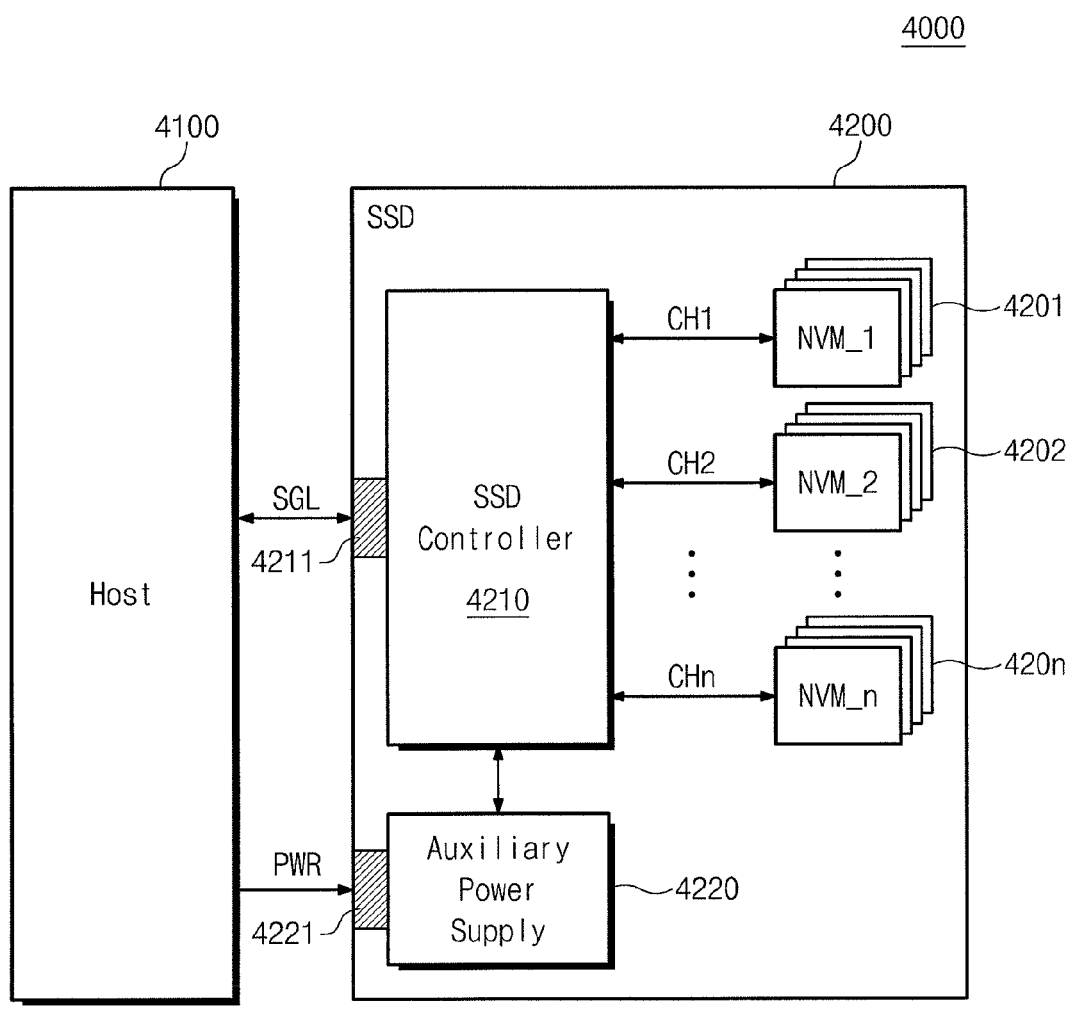
FIG. 21 is a block diagram illustrating an exemplary solid state drive (SSD) to which a flash memory system according to an embodiment of the inventive concept is applied.

FIG. 21 is a block diagram illustrating an exemplary solid state drive (SSD) to which a flash memory system according to an embodiment of the inventive concept is applied. Referring to FIG. 21, a SSD system 4000 may include a host 4100 and a SSD 4200.

The SSD 4200 may exchange a signal with a host 4100 through a signal connector 4211, and receives power through a power connector 4211. The SSD 4200 may include a plurality of flash memories 4201 to 420n, an SSD controller 4210, and an auxiliary power device 4220. Here, the plurality of flash memories 4201 to 420n or the SSD controller 4210 may include the WL interleaving (not shown) described above.

The plurality of flash memories 4201 to 420n may be used as a storage medium. The SSD 4200 may use a nonvolatile memory device such as PRAM, MRAM, ReRAM, and FRAM in addition to a flash memory. The plurality of flash memories 4201 to 420n may be connected to the SSD controller 4210 through a plurality of channels CH1 to CHn. At least one flash memory may be connected to one channel. A flash memory connected to one channel may be connected to the same data bus.

The SSD controller 4210 exchanges a signal SGL with the host 4100 through the signal connector 4211. Here, the SGL may include a command, an address, and data. The SSD controller 4210 writes data in a corresponding flash memory or reads data from a corresponding flash memory according to a command of the host 4100. The internal configuration of the SSD controller 4210 will be described in detail with reference to FIG. 22.

The auxiliary power device 4220 may be connected to the host 4100 through the power connector 4221. The auxiliary power device 4220 may receive power PWR from the host 4100. The auxiliary power device 4220 may be placed inside or outside the SSD 4200. For example, the auxiliary power device 4220 may be placed in a main board and may provide auxiliary power to the SSD 4200.

Figure 22:
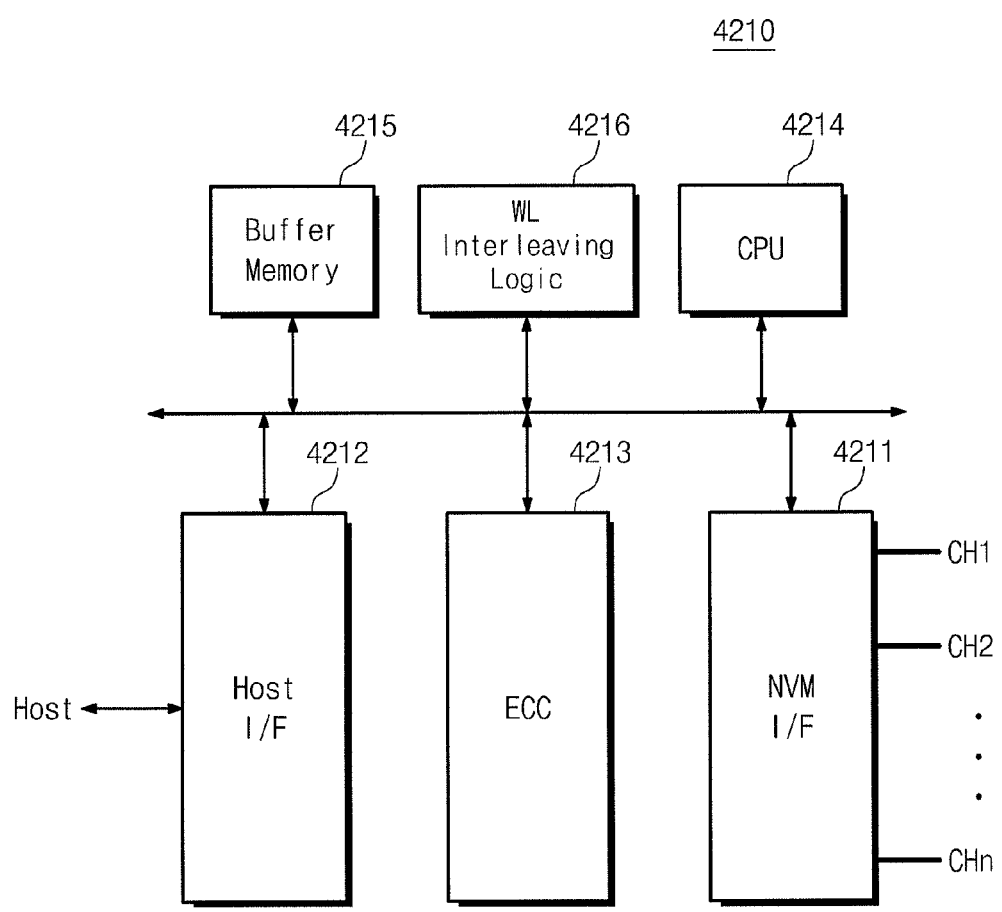
FIG. 22 is a block diagram illustrating an exemplary configuration of an SSD controller of FIG. 21.

FIG. 22 is a block diagram illustrating an exemplary configuration of the SSD controller 4210 of FIG. 21. Referring to FIG. 22, the SSD controller 4210 may include an NVM interface 4211, a host interface 4212, an ECC circuit 4213, a central processing unit (CPU) 4214, a buffer memory 4215, and a WL interleaving logic 4216.

The NVM interface 4211 may scatter data delivered from the buffer memory 4215 into the respective channels CH1 to CHn. Moreover, the NVM interface 4211 may deliver the data read from the flash memories 4201 to 420n to the buffer memory 4215. Here, the NVM interface 4211 may use a flash memory interfacing method. That is, the SSD controller 4210 may perform a program, read, or erase operation according to the flash memory interface method.

The host interface 4212 may provide an interface with the SSD 4200 corresponding to a protocol of the host 4100. The host interface 4212 may communicate with the host 4100 through universal serial bus (USB), a small computer system interface (SCSI), a PCI express, ATA, a parallel ATA (PATA), a serial ATA (SATA), and a serial attached SCSI (SAS). Moreover, the host interface 4212 may perform disk emulation for supporting the host 4100 to recognize a SSD as a hard disk drive (HDD).

The ECC circuit 4213 may generate an error correction code (ECC) using data transmitted to the flash memories 4201 to 420n. The generated ECC is stored in a spare area of the flash memories 4201 to 420n. The ECC circuit 4213 may detect an error of the data read from the flash memories 4201 to 420n. If the detected error falls in the correction capacity, the ECC circuit 4213 may correct the detected error.

The CPU 4214 may analyze and process a signal SGL input from the host (4100 of FIG. 21). The CPU 4214 may control the host 4100 or the flash memories 4201 to 420n through the host interface 4212 or the NVM interface 4211. The CPU 4214 may control operations of the flash memories 4201 to 420n according to a firmware for driving the SSD 4200.

The buffer memory 4215 may temporarily store write data provided from the host 4100 or data read from the flash memory. Moreover, the buffer memory 4215 may store meta data or cache data to be stored in the flash memories 4201 to 420n. Upon a sudden power-off operation, the meta data or cache data stored in the buffer memory 4215 may be stored in the flash memories 4201 to 420n. The buffer memory 4215 may include a DRAM, an SRAM, and the like. The SSD 4000 shown in FIGS. 21 and 22 may alleviate a BER imbalance using the WL interleaving logic 4216 as described above.

Figure 23:
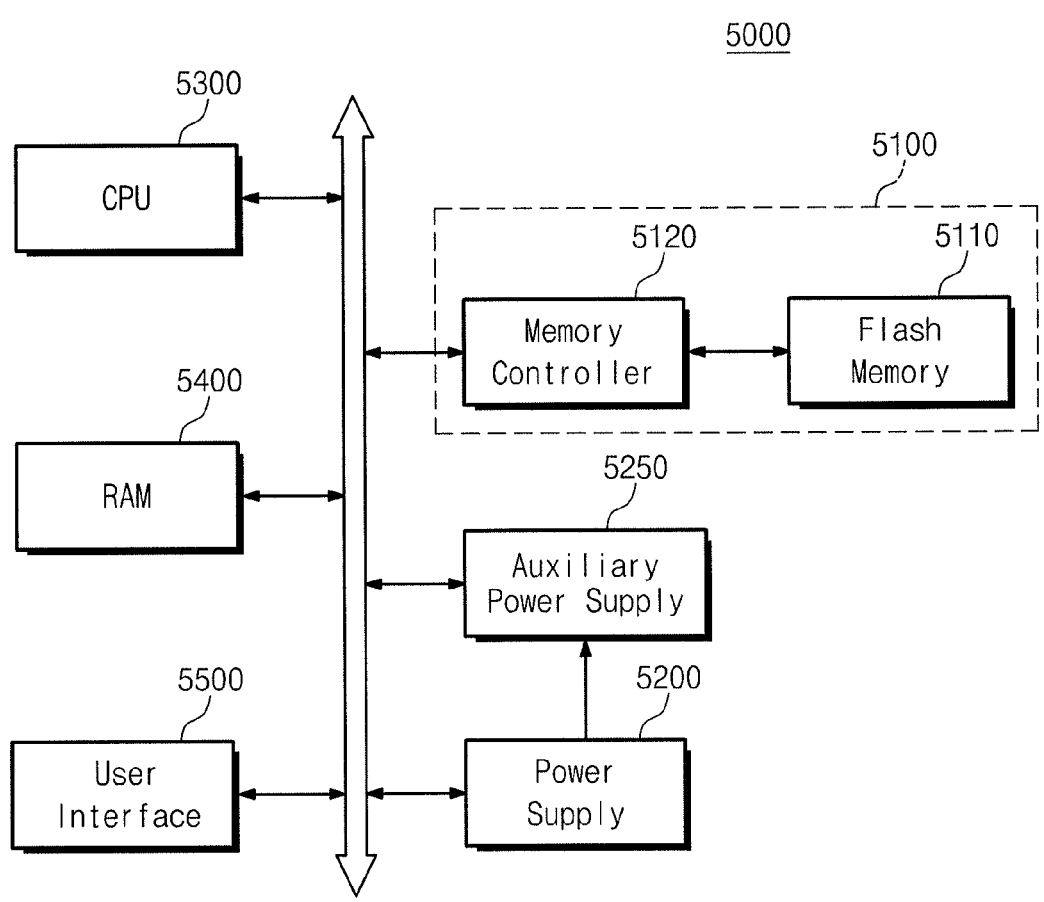
FIG. 23 is a block diagram illustrating an exemplary electronic device in which a flash memory system according to an embodiment of the inventive concept is implemented.

FIG. 23 is a block diagram illustrating an exemplary electronic device in which a flash memory system according to an embodiment of the inventive concept is implemented. Here, the electronic device 5000 may be implemented in a personal computer (PC) or a portable electronic device, e.g., a notebook computer, a mobile phone, a personal digital assistant (PDA), and a camera.

Referring to FIG. 23, the electronic device 5000 includes a memory system 5100, a power device 5200, an auxiliary power device 5250, a CPU 5300, a RAM 5400, and a user interface 5500. The memory system 5100 may include a flash memory 5110 and a memory controller 5120. The memory system 5100 may alleviate a BER imbalance using the WL interleaving logic in accordance with embodiments as described above.

By way of summary and review, the flash memory system and a word line interleaving method thereof according to embodiments of the inventive concept can alleviate the imbalance of BER, and reduce the burden of an ECC circuit.

The above-disclosed subject matter is to be considered illustrative and not restrictive, and the appended claims are intended to cover all such modifications, enhancements, and other embodiments, which fall within the true spirit and scope of the inventive concept. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of operating a memory having a memory cell array, memory cells in the memory cell array having varying cell conditions, and a plurality of wordlines coupled to memory cells along one direction of the array, the method comprising:
   interleaving data for at least two different wordlines, interleaved data has a bit error rate equal to an average of the bit error rate of the at least two wordlines; and
   programming data, including the interleaved data, to the memory cell array.

2. The method as claimed in claim 1, further comprising, before interleaving data, ECC encoding data.

3. The method as claimed in claim 1, wherein interleaving data for at least two different wordlines includes interleaving data for all wordlines of the memory cell array.

4. The method as claimed in claim 1, wherein the memory cell array includes a plurality of memory blocks, the plurality of memory blocks including a plurality of planes connected by word lines and separated by selection lines.

5. The method as claimed in claim 4, wherein interleaving data from at least two different wordlines includes interleaving data for different wordlines of a same plane.

6. The method as claimed in claim 4, wherein interleaving data from at least two different wordlines includes interleaving data for all wordlines of a same plane.

7. The method as claimed in claim 4, wherein interleaving data from at least two different wordlines includes interleaving data for a same wordline in different planes.

8. The method as claimed in claim 4, wherein interleaving data for at least two different wordlines includes interleaving data for different wordlines within a plane across different planes.

9. The method as claimed in claim 1, wherein each memory cell is a stacked memory cell, a width of a stacked memory cell increasing along a stacking direction of the plurality of memory cells, and wherein each wordline is coupled to memory cells along a direction orthogonal to the stacking direction.

10. The method as claimed in claim 1, further comprising determining a size of word line data to be interleaved.

11. The method as claimed in claim 1, wherein the memory cell array is a three-dimensional array.

12. The method as claimed in claim 1, wherein the memory cell array is a flash memory cell array.

13. A memory system, comprising:
   a memory device including
      a memory cell array having an array of memory cells, and
      a plurality of wordlines, each wordline being coupled to memory cells along a direction of the array;
   a wordline interleaver configured to interleave data for at least two different wordlines, interleaved data has a bit error rate equal to an average of the bit error rate of the at least two wordlines; and
   a memory controller configured to program data, including the interleaved data, to the memory cell array.

14. The memory system as claimed in claim 13, wherein the wordline interleaver is part of the memory device.

15. The memory system as claimed in claim 13, wherein the wordline interleaver is part of the memory controller.

16. The memory system as claimed in claim 13, wherein the memory device and the memory controller are part of a storage device.

17. The memory system as claimed in claim 16, wherein the wordline interleaver is part of the storage device.

18. The memory system as claimed in claim 17, wherein the storage device is part of a memory card.

19. The memory system as claimed in claim 17, wherein the storage device is part of a solid state device.

20. The memory system as claimed in claim 16, further comprising a host to which the storage device is to communicate.

21. The memory system as claimed in claim 20, wherein the wordline interleaver is in the host.

22. The memory system as claimed in claim 13, wherein the wordline interleaver is configured to determine a size of word line data to be interleaved.

23. The memory system as claimed in claim 13, wherein the memory cell array is a two-dimensional array.

24. The memory system as claimed in claim 13, wherein the memory cell array is a three-dimensional array.

25. The memory system as claimed in claim 24, wherein each memory cell is a stacked memory cell, a width of a stacked memory cell increasing along a stacking direction of the plurality of memory cells, and wherein each wordline is coupled to memory cells along a direction orthogonal to the stacking direction.

26. The memory system as claimed in claim 13, further comprising an ECC decoder.

27. The memory system as claimed in claim 13, wherein the wordline interleaver is configured to interleave data for all wordlines of the memory cell array.

28. The memory system as claimed in claim 13, wherein the memory cell array includes a plurality of memory blocks, the plurality of memory blocks including a plurality of planes connected by word lines and separated by selection lines.

29. The memory system as claimed in claim 28, wherein the wordline interleaver is configured to interleave data for different wordlines of a same plane.

30. The memory system as claimed in claim 28, wherein the wordline interleaver is configured to interleave data for all wordlines of a same plane.

31. The memory system as claimed in claim 28, wherein the wordline interleaver is configured to interleave data for a same wordline in different planes.

32. The memory system as claimed in claim 28, wherein the wordline interleaver is configured to interleave data for different wordlines within a plane across different planes.

33. The memory system as claimed in claim 13, wherein the memory cell array is a flash memory cell array.

34. An electronic device including the memory system recited in claim 13.

* * * * *